(12) United States Patent
Sudo et al.

(10) Patent No.: US 10,401,798 B2
(45) Date of Patent: Sep. 3, 2019

(54) TIME-TO-DIGITAL CONVERTER, CIRCUIT DEVICE, PHYSICAL QUANTITY MEASUREMENT APPARATUS, ELECTRONIC APPARATUS, AND VEHICLE

(71) Applicant: Seiko Epson Corporation, Tokyo (JP)

(72) Inventors: Yasuhiro Sudo, Chino (JP); Hideo Haneda, Matsumoto (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 16/106,094

(22) Filed: Aug. 21, 2018

(65) Prior Publication Data

US 2019/0064747 A1 Feb. 28, 2019

(30) Foreign Application Priority Data

Aug. 22, 2017 (JP) ................. 2017-159122

(51) Int. Cl.
| | |
|---|---|
| *H03M 1/50* | (2006.01) |
| *G04F 10/00* | (2006.01) |
| *H03K 5/26* | (2006.01) |
| *G06F 1/06* | (2006.01) |
| *H03K 19/20* | (2006.01) |
| *H03B 5/32* | (2006.01) |
| *H03B 5/04* | (2006.01) |

(52) U.S. Cl.
CPC .............. *G04F 10/005* (2013.01); *G06F 1/06* (2013.01); *H03K 5/26* (2013.01); *H03B 5/04* (2013.01); *H03B 5/32* (2013.01); *H03K 19/20* (2013.01)

(58) Field of Classification Search
CPC ........ G04F 10/005; H03K 5/26; H03K 19/20; G06F 1/06; H03B 5/04; H03B 5/32; H03M 1/12; H03M 1/00

USPC .................................................. 341/166, 155
See application file for complete search history.

(56) References Cited

U.S. PATENT DOCUMENTS

| | | | |
|---|---|---|---|
| 7,016,451 B2* | 3/2006 | Harrison | G11C 7/1072 375/374 |
| 8,017,580 B2* | 9/2011 | Cohen | A61K 38/1875 424/422 |
| 8,390,348 B2* | 3/2013 | Burcea | G01S 7/28 327/147 |

(Continued)

FOREIGN PATENT DOCUMENTS

| | | |
|---|---|---|
| JP | 62-228191 A | 10/1987 |
| JP | 64-079687 A | 3/1989 |

*Primary Examiner* — Jean B Jeanglaude
(74) *Attorney, Agent, or Firm* — Harness, Dickey & Pierce, P.L.C.

(57) ABSTRACT

A time-to-digital converter includes a clock signal generation circuit that generates a first cycle signal having a voltage level that monotonously increases or decreases in a cycle corresponding to the clock frequency of a reference clock signal and further generates a first clock signal based on a first signal and the first cycle signal, a clock signal generation circuit that generates a second cycle signal having a voltage level that monotonously increases or decreases in a cycle corresponding to the clock frequency of a reference clock signal and further generates a second clock signal based on a second signal and the second cycle signal, and a processing circuit that converts a time difference between the transition timing of the first signal and the transition timing of the second signal into a digital value based on the first and second clock signals.

13 Claims, 12 Drawing Sheets

(56) References Cited

U.S. PATENT DOCUMENTS

| | | | |
|---|---|---|---|
| 9,257,964 B2 * | 2/2016 | Zhu .................... | H03K 5/1565 |
| 2002/0075050 A1 * | 6/2002 | Ma ..................... | H03K 5/1565 |
| | | | 327/175 |
| 2007/0176659 A1 * | 8/2007 | Gomm ................ | H03K 5/1565 |
| | | | 327/175 |
| 2012/0223743 A1 * | 9/2012 | Burcea ................ | G01S 7/28 |
| | | | 327/63 |
| 2014/0176218 A1 * | 6/2014 | Zhu .................... | H03K 5/1565 |
| | | | 327/298 |

* cited by examiner

TIME-TO-DIGITAL CONVERTER, CIRCUIT DEVICE, PHYSICAL QUANTITY MEASUREMENT APPARATUS, ELECTRONIC APPARATUS, AND VEHICLE

BACKGROUND

1. Technical Field

The present invention relates to a time-to-digital converter, a circuit device, a physical quantity measurement apparatus, an electronic apparatus, a vehicle, and the like.

2. Related Art

There has been a known time-to-digital converter that converts time into a digital value. As an example of a time-to-digital converter of related art that measures a time difference between a first signal and a second signal produced at arbitrary timings, there are, for example, related-art technologies disclosed in JP-A-64-079687 and JP-A-62-228191.

JP-A-64-079687 describes a time clocking circuit that includes a first oscillator that starts oscillating at a frequency f when a start signal is produced and a second oscillator that starts oscillating at a frequency f+Δf in when a stop signal is produced and compares the phase of a clock signal from the first oscillator with the phase of a clock signal from the second oscillator to measure the time gap between the start signal and the stop signal.

JP-A-62-228191 describes a time measurement apparatus that produces a triangular wave that synchronizes with a clock signal, measures the voltage of the triangular wave at the transition timing of a first signal and the voltage of the triangular wave at the transition timing of a second signal, and calculates the time gap between the first signal and the second signal based on the result of the measurement.

A time-to-digital converter, such as those described above, is required to have increased performance (increased resolution or accuracy, for example).

For example, in the configuration described in JP-A-64-079687, a ring oscillator is, for example, used as each of the first and second oscillators. Therefore, the characteristics of the clock signal from each of the oscillators (for example, temperature characteristic, process variation, and jitter characteristic) affect the time clocking accuracy, undesirably resulting in insufficient time clocking accuracy in some cases. It is conceivable to use, for example, a quartz crystal oscillator as an oscillator having excellent oscillation characteristics. However, since it is difficult to control the start of a quartz crystal oscillator, it is difficult to start oscillation at the transition timing of the first signal (or second signal).

In the configuration described in JP-A-62-228191, since one clock signal is used, factors other than the characteristics of the clock signal could affect the time measurement accuracy. That is, in the time-to-digital converter described in JP-A-64-079687, the frequency difference (Δf) in the oscillation frequency between the first and second oscillators is used to measure time, whereas in JP-A-62-228191, the triangular wave that synchronizes with the one clock signal is used to measure time. The accuracy of generation of the waveform of the triangular wave (distortion of waveform, for example) could affect the time measurement accuracy.

SUMMARY

An advantage of some aspects of the invention is to solve at least a part of the problems described above, and the invention can be implemented as the following forms or embodiments.

An aspect of the invention relates to a time-to-digital converter including a first clock signal generation circuit to which a first reference clock signal having a first clock frequency is inputted and which generates a first cycle signal having a voltage level that monotonously increases or decreases in a cycle corresponding to the first clock frequency and further generates a first clock signal based on a first signal and the first cycle signal, a second clock signal generation circuit to which a second reference clock signal having a second clock frequency different from the first clock frequency is inputted and which generates a second cycle signal having a voltage level that monotonously increases or decreases in a cycle corresponding to the second clock frequency and further generates a second clock signal based on a second signal and the second cycle signal, and a processing circuit that converts a time difference between a transition timing of the first signal and a transition timing of the second signal into a digital value based on the first and second clock signals.

According to the aspect of the invention, the first and second reference clock signals inputted externally to the time-to-digital converter can be used to convert the time difference between the transition timings of the first and second signals inputted externally to the time-to-digital converter (produced at arbitrary timings) into a digital value. The first and second reference clock signals, which are each generated by using an oscillator having excellent oscillation characteristics (jitter characteristic and process variation, for example), for example, a quartz crystal resonator, can therefore be used to measure time, whereby the measurement can be performed at the time resolution corresponding to the frequency difference between the first and second reference clock signals, and the performance of the time-to-digital converter can be increased by using the first and second reference clock signals having excellent characteristic.

In the aspect of the invention, the first clock signal generation circuit may generate the first clock signal, a frequency of which is equal to the first clock frequency and a phase of which is set with reference to the transition timing of the first signal, based on the first signal and the first cycle signal, and the second clock signal generation circuit may generate the second clock signal, a frequency of which is equal to the second clock frequency and a phase of which is set with reference to the transition timing of the second signal, based on the second signal and the second cycle signal.

As described above, the configuration in which the voltage level of the first cycle signal monotonously increases or decreases in the cycle corresponding to the first clock frequency allows generation of the first clock signal, the frequency of which is equal to the first clock frequency and the phase of which is set with reference to the transition timing of the first signal. Similarly, the configuration in which the voltage level of the second cycle signal monotonously increases or decreases in the cycle corresponding to the second clock frequency allows generation of the second clock signal, the frequency of which is equal to the second clock frequency and the phase of which is set with reference to the transition timing of the second signal. Generating the first and second clock signals as described above and using the first and second reference clock signals externally inputted to the time-to-digital converter allow the time difference between the transition timings of the first and second reference clock signals externally inputted to the time-to-digital converter to be converted into a digital value.

In the aspect of the invention, the first clock signal generation circuit may include a first holding circuit that holds the voltage level of the first cycle signal at the transition timing of the first signal as a first threshold voltage and a first comparison circuit that compares the first threshold voltage with the voltage level of the first cycle signal and outputs the first clock signal, and the second clock signal generation circuit may include a second holding circuit that holds the voltage level of the second cycle signal at the transition timing of the second signal as a second threshold voltage and a second comparison circuit that compares the second threshold voltage with the voltage level of the second cycle signal and outputs the second clock signal.

The configuration described above allows the phase difference between an edge of the first reference clock signal and the edge of the first signal to be equal to the phase difference between an edge of the first reference clock signal and an edge of the first clock signal. That is, the first clock signal, the phase of which is set with reference to the transition timing of the first signal, can be produced based on the first signal and the first cycle signal. The configuration described above further allows the phase difference between an edge of the second reference clock signal and the edge of the second signal to be equal to the phase difference between an edge of the second reference clock signal and an edge of the second clock signal. That is, the second clock signal, the phase of which is set with reference to the transition timing of the second signal, can be produced based on the second signal and the second cycle signal.

In the aspect of the invention, the first clock signal generation circuit may include a first mask circuit that masks first one or plurality of pulses of the first clock signal, and the second clock signal generation circuit may include a second mask circuit that masks first one or plurality of pulses of the second clock signal.

As described above, the first clock signal is generated by comparison between the first threshold voltage and the first cycle signal, and the second clock signal is generated by comparison between the second threshold voltage and the second cycle signal. The first one or plurality of pulses of each of the thus generated first and second clock signals could be unstable (for example, the first one or plurality of pulses do not accurately reflect the phase of the transition timing of the first and second signals). According to the aspect of the invention, the unstable pulses can be masked, and first and second clock signals that reflect the phases of the edges of the first and second signals can be outputted.

In the aspect of the invention, the processing circuit may include a first phase comparison circuit that compares the first clock signal with the second clock signal in terms of phase and output the digital value based on a result of the phase comparison.

In the configuration described above, comparison between the phase of the first clock signal and the phase of the second clock signal allows detection of whether the order of the edges of the first clock signal and the edges of the second clock signal is reversed. The time difference between the transition timing of the first signal and the transition timing of the second signal can be determined based on the number of clocks of the first and second clock signals until the change occurs.

In the aspect of the invention, the time-to-digital converter may further include a third clock signal generation circuit that generates a third cycle signal having a phase different from a phase of the first cycle signal based on the first reference clock signal and further generates a third clock signal based on the first signal and the third cycle signal and a fourth clock signal generation circuit that generates a fourth cycle signal having a phase different from a phase of the second cycle signal based on the second reference clock signal and further generates a fourth clock signal based on the second signal and the fourth cycle signal.

Since the first signal having an arbitrary phase is inputted (the first signal is inputted at an arbitrary timing) with respect to the first reference clock signal, the first cycle signal and the first signal each have an arbitrary phase. There is a possibility of no appropriate generation of the first clock signal. The same holds true for the second clock signal. The aspect of the invention allows generation of the first and third cycle signals that synchronize with the first reference clock signal and differ in phase from each other. The phase difference between the first signal and the first cycle signal therefore differs from the phase difference between the first signal and the third cycle signal, whereby the first clock signal can be appropriately generated. Further, the aspect of the invention allows generation of the third and fourth cycle signals that synchronize with the second reference clock signal and differ in phase from each other. The phase difference between the second signal and the second cycle signal therefore differs from the phase difference between the second signal and the fourth cycle signal, whereby the second clock signal can be appropriately generated.

In the aspect of the invention, the processing circuit may include a first phase comparison circuit that compares the first clock signal with the second clock signal in terms of phase, a second phase comparison circuit that compares the first clock signal with the fourth clock signal in terms of phase, a third phase comparison circuit that compares the third clock signal with the second clock signal in terms of phase, and a fourth phase comparison circuit that compares the third clock signal with the fourth clock signal in terms of phase, and the processing circuit may output the digital value based on results of the phase comparison performed by the first to fourth phase comparison circuits.

According to the configuration, the phase comparison is performed on the four combinations between the first and third clock signals and the second and fourth clock signals, and the digital value of the time difference is determined based on the results of the phase comparison. The first and third clock signals are generated based on the first signal and the first and third cycle signals, which differs in phase from each other, and the second and fourth clock signals are generated based on the second signal and the second and fourth cycle signals, which differs in phase from each other. It is therefore expected that a combination of clock signals generated appropriately for the first and second signals generated at arbitrary timings is obtained by using at least one of the four combinations described above.

In the aspect of the invention, the first clock signal generation circuit may include a first holding circuit that holds the voltage level of the first cycle signal at the transition timing of the first signal as a first threshold voltage and a first comparison circuit that compares the first threshold voltage with the voltage level of the first cycle signal and outputs the first clock signal, the second clock signal generation circuit may include a second holding circuit that holds the voltage level of the second cycle signal at the transition timing of the second signal as a second threshold voltage and a second comparison circuit that compares the second threshold voltage with the voltage level of the second cycle signal and outputs the second clock signal, the third clock signal generation circuit may include a third holding circuit that holds a voltage level of the third cycle signal at the transition timing of the first signal as a third threshold voltage and a third comparison circuit that compares the third threshold voltage with the voltage level of the third cycle signal and outputs the third clock signal, the fourth clock signal generation circuit may include a fourth holding circuit that holds a voltage level of the fourth cycle signal at the transition timing of the second signal as a fourth threshold voltage and a fourth comparison circuit that compares the fourth threshold voltage with the voltage level of the fourth cycle signal and outputs the fourth clock signal, and the processing circuit may include a threshold evaluation circuit that evaluates whether or not the first to fourth threshold voltages each fall within a given voltage range and select any of results of the phase comparison performed by the first to fourth phase comparison circuits based on results of the evaluation and uses a selected result of the phase comparison to determine the digital value.

According to the configuration, the time difference between the transition timing of the first signal and the transition timing of the second signal can be determined from the clock signal generated by using the threshold voltage within the given voltage range. The digital value of the time difference can therefore be determined based on an appropriately generated clock signal, whereby the time measurement can be performed with high quality.

Another aspect of the invention relates to a circuit device including any of the time-to-digital converters described above.

In the other aspect of the invention, the circuit device may further include a first oscillation circuit that causes a first oscillator to oscillate to generate a first oscillation signal and further generates the first reference clock signal based on the first oscillation signal and a second oscillation circuit that causes a second oscillator to oscillate to generate a second oscillation signal and further generates the second reference clock signal based on the second oscillation signal.

The first and second oscillation circuits use the first and second oscillators to generate the first and second reference clock signals, and the time-to-digital converter can therefore use the first and second reference clock signals, which have excellent characteristics (jitter characteristic, for example) to perform the time digital conversion. As a result, the time measurement can be performed with increased quality.

Still another aspect of the invention relates to a physical quantity measurement apparatus including any of the time-to-digital converters described above.

Still another aspect of the invention relates to an electronic apparatus including any of the time-to-digital converters described above.

Still another aspect of the invention relates to a vehicle including any of the time-to-digital converters described above.

BRIEF DESCRIPTION OF THE DRAWINGS

The invention will be described with reference to the accompanying drawings, wherein like numbers reference like elements.

DESCRIPTION OF EXEMPLARY EMBODIMENTS

A preferable embodiment of the invention will be described below in detail. It is not intended that the present embodiment described below unduly limits the contents of the invention set forth in the appended claims, and all configurations described in the present embodiment are not necessarily essential as solutions provided by the invention.

Figure 1:
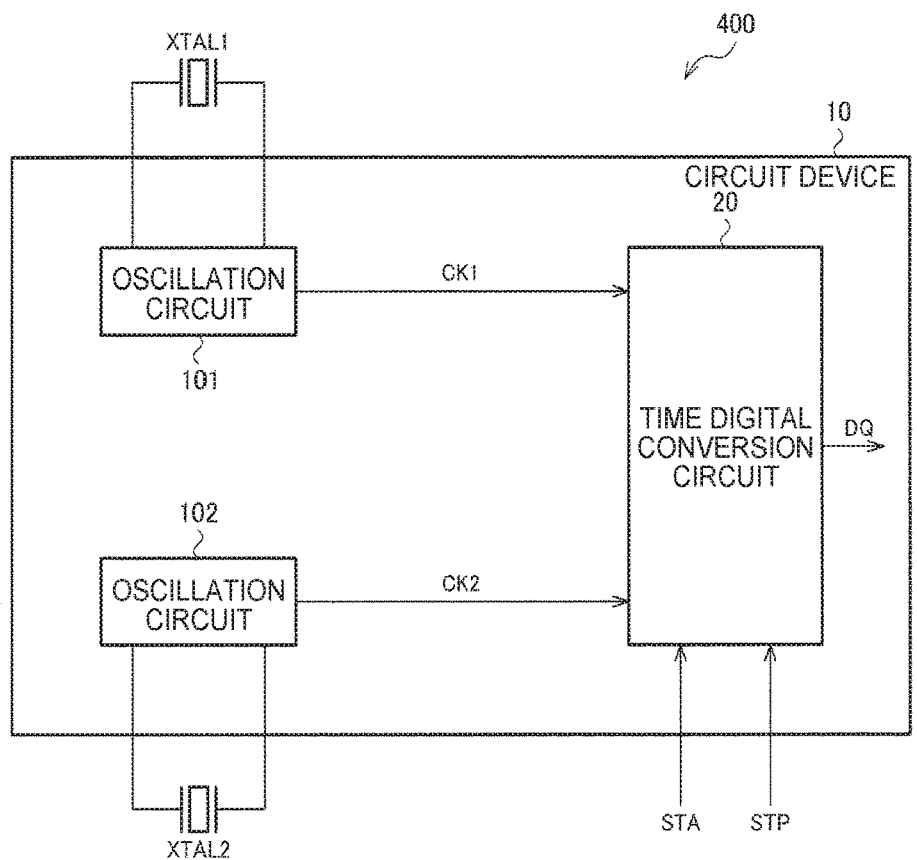
FIG. 1 shows a first example of the configurations of a circuit device and a physical quantity measurement apparatus.

1. Time-to-Digital Converter, a Circuit Device, and a Physical Quantity Measurement Apparatus FIG. 1 shows a first example of the configurations of a circuit device including a time-to-digital converter according to the present embodiment and a physical quantity measurement apparatus including the circuit device. A physical quantity measurement apparatus 400 includes an oscillator XTAL1 (first oscillator oscillator), an oscillator XTAL2 (second oscillator), and a circuit device 10. The physical quantity measurement apparatus does not necessarily have the configuration shown in FIG. 1, and a variety of variations are conceivable, for example, part of the components of the configuration shown in FIG. 1 may be omitted, or another component may be added to the configuration shown in FIG. 1.

The oscillators XTAL1 and XTAL2 are each, for example, a piezoelectric resonator. Specifically, the oscillator is, for example, a quartz crystal resonator. An example of the quartz crystal resonator is, for example, a quartz crystal resonator that undergoes thickness slide resonance, such as a quartz crystal resonator cut at an AT cut angle or an SC cut angle. For example, the oscillator may be a resonator built in an oven controlled crystal oscillator (OCXO) including an oven, a resonator built in a temperature compensated crystal oscillator (TCXO) including no oven, or a resonator built in a simple package crystal oscillator (SPXO). The oscillator may instead, for example, be a surface acoustic wave (SAW) resonator or a MEMS (micro electro mechanical systems) resonator in the form of a silicon resonator formed by using a silicon substrate.

The circuit device 10 is formed, for example, of an integrated circuit device (semiconductor circuit device). The circuit device 10 includes an oscillation circuit 101 (first oscillation circuit), an oscillation circuit 102 (second oscillation circuit), and a time-to-digital converter 20. The configuration of the circuit device does not necessarily have the configuration shown in FIG. 1. For example, the oscillation circuits 101 and 102 may be circuits external to the circuit device. That is, the oscillator XTAL1 and the oscillation circuit 101 may be configured as the first oscillator, the oscillator XTAL2 and the oscillation circuit 102 may be configured as the second oscillator, and clock signals from the first and second oscillators may be inputted to the circuit device.

The oscillation circuit 101 uses the oscillator XTAL1 to generate a reference clock signal CK1 (first reference clock signal) having a clock frequency f1 (first clock frequency). Specifically, the oscillation circuit 101 causes the oscillator XTAL1 to oscillate to generate an oscillation signal (first oscillation signal) and generates the reference clock signal CK1 based on the oscillation signal. The oscillation circuit 102 uses the oscillator XTAL2 to generate a reference clock signal CK2 (second reference clock signal) having a clock frequency f2 (second clock frequency). Specifically, the oscillation circuit 102 causes the oscillator XTAL2 to oscillate to generate an oscillation signal (second oscillation signal) and generates the reference clock signal CK2 based on the oscillation signal. For example, the oscillation circuits 101 and 102 buffer the first and second oscillation signals and output the reference clock signals CK1 and CK2, respectively. The oscillation circuits 101 and 102 instead divide the first and second oscillation signals and output the reference clock signals CK1 and CK2, respectively. The clock frequencies f1 and f2 differ from each other, and f1<f2, for example. The oscillation circuits 101 and 102 are each, for example, a pierce-type oscillation circuit in which an oscillator is connected to a feedback loop between the base and the emitter or the collector and the base of a bipolar transistor. The oscillation circuits 101 and 102 are each instead an oscillation circuit in which an oscillator is connected to a feedback loop between the input and the output of an odd number of inverters (logic inversion circuits).

The time-to-digital converter 20 uses the reference clock signals CK1 and CK2 to convert a time difference between the transition timing of a signal STA (first signal, for example, start signal) and the transition timing of a signal STP (second signal, for example, stop signal) into a digital value DQ. Specifically, the time-to-digital converter 20 converts time into a digital value at a resolution corresponding to the difference in frequency between the clock frequencies f1 and f2 or |f1−f2|. The resolution can be expressed by $\Delta t=|1/f1-1/f2|=|f1-f2|/(f1 \times f2)$. The clock frequencies f1 and f2 are so selected that a desired resolution $\Delta t$ is achieved.

The time difference between the transition timings of the signals STA and STP is the inter-edge time difference between the signals STA and STP (between rising or falling edges, for example). For example, in a case where the physical quantity measurement apparatus 400 is a time-of-flight (TOF) distance measurement apparatus, the physical quantity measurement apparatus 400 may further include a light source, a processor that outputs a light emission control signal to the light source, and a light receiving sensor that receives light reflected off a target object. In this case, the signal STA is used to output radiated light (laser beam, for example) to the target object (object around car, for example) and receives the light reflected off the target object to produce the signal STP. For example, the light source emits light based on the light emission control signal from the processor, the light emission control signal is inputted as the signal STA to the circuit device, and a light reception signal from the light receiving sensor is inputted as the signal STP to the circuit device. For example, the signal STP is produced by shaping the waveform of the light reception signal. The distance to the target object can therefore be measured as a physical quantity and can be used, for example, to automatically drive a car or control the action of a robot.

Instead, in a case where the physical quantity measurement apparatus 400 is an ultrasonic measurement apparatus, the physical quantity measurement apparatus 400 can further include an ultrasonic probe and a processor that controls the ultrasonic probe. In this case, the signal STA is used to transmit a transmission sound wave (ultrasonic wave, for example) to a target object (living body, for example) and receives a reception sound wave from the target object to produce the signal STP. For example, the processor transmits a pulse signal to the ultrasonic probe, the ultrasonic probe transmits an ultrasonic wave based on the pulse signal, the pulse signal is inputted as the signal STA to the circuit device, and the ultrasonic probe receives the wave reflected off the target object to produce the signal STP. That is, the signal STP is produced, for example, by shaping the waveform of the reception sound wave. The distance to the target object or any other factor can therefore be measured as a physical quantity, and the ultrasonic wave can be used to, for example, measure biological information.

The physical quantity measured in the present embodiment is not limited to time or a distance and conceivably further includes a flow rate, a flow speed, a frequency, velocity, acceleration, angular velocity, angular acceleration, or any of a variety of other physical quantities.

Figure 2:
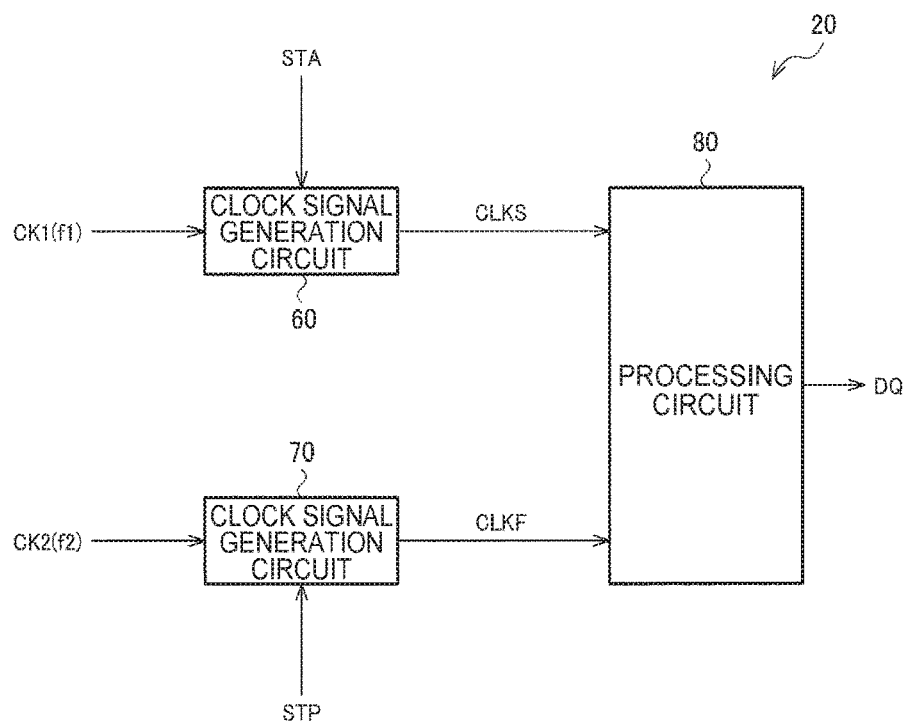
FIG. 2 shows a first example of the configuration of a time-to-digital converter according to an embodiment of the invention.
Figure 3:
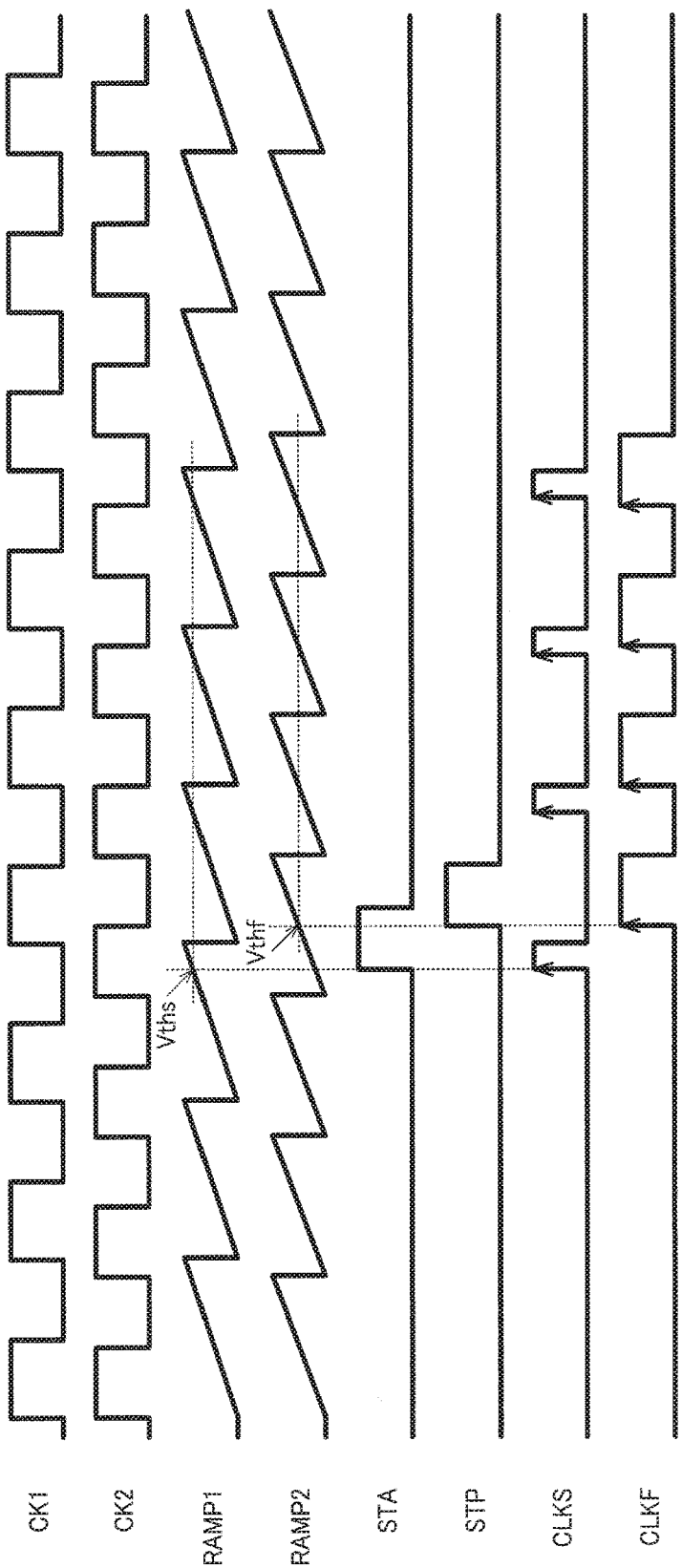
FIG. 3 is a timing chart for describing the action of the time-to-digital converter having the configuration of the first example.

FIG. 2 shows a first example of the configuration of the time-to-digital converter according to the present embodiment. FIG. 3 is a timing chart for describing the action of the time-to-digital converter having the configuration of the first example.

The time-to-digital converter 20 includes a clock signal generation circuit 60 (first clock signal generation circuit), a clock signal generation circuit 70 (second clock signal generation circuit), and a processing circuit 80, as shown in FIG. 2. The physical quantity measurement apparatus does not necessarily have the configuration shown in FIG. 1, and a variety of variations are conceivable, for example, part of the components of the configuration shown in FIG. 1 may be omitted, or another component may be added to the configuration shown in FIG. 1.

The reference clock signal CK1 having the clock frequency f1 is inputted to the clock signal generation circuit 60. The clock signal generation circuit 60 generates a cycle signal RAMP1 (first cycle signal), the voltage level of which monotonously increases in the cycle corresponding to the clock frequency f1, and further produces a clock signal CLKS (first clock signal) based on the signal STA and the cycle signal RAMP1, as shown in FIG. 3.

The cycle signal RAMP1 is a signal having a waveform formed of a single shape cyclically repeated at the clock frequency f1. The voltage level of the cycle signal RAMP1 monotonously increases in one cycle (each cycle) of the reference clock signal CK1. That is, the voltage level monotonously increases between the same-kind edges of the reference clock signal CK1 (between rising edges or falling edges, for example). The cycle signal RAMP1 is, for example, a ramp-wave signal having a linearly increasing voltage level, as shown in FIG. 3, but not necessarily, and the voltage level may monotonously increase along a curve as long as the waves in all cycles have the same shape. FIG. 3 shows the case where the voltage level of the cycle signal RAMP1 monotonously increases in each cycle of the reference clock signal CK1, and the voltage level of the cycle signal RAMP1 may instead monotonously decrease in each cycle of the reference clock signal CK1. Further, FIG. 3 shows a case where the phase of the reference clock signal CK1 coincides with the phase of the cycle signal RAMP1, but the phase of the reference clock signal CK1 may not coincide with the phase of the cycle signal RAMP1. That is, the voltage level of the cycle signal RAMP1 may start monotonously increasing or decreasing at a timing (phase) shifted from an edge of the reference clock signal CK1.

The clock signal CLKS is a clock signal having the same frequency as that of the clock frequency f1, and the clock signal generation circuit 60 starts generating the clock signal CLKS based on the transition timing of the signal STA. Specifically, the phase difference between the reference clock signal CK1 and the clock signal CLKS is the inter-edge phase difference between the reference clock signal CK1 and the signal STA (between rising edges or falling edges, for example). The generation of the clock signal CLKS is achieved by using the fact that the voltage level of the cycle signal RAMP1 monotonously increases in each cycle of the reference clock signal CK1.

The reference clock signal CK2 having the clock frequency f2, which differs from the clock frequency f1, is inputted to the clock signal generation circuit 70. The clock signal generation circuit 70 generates a cycle signal RAMP2 (second cycle signal), the voltage level of which monotonously increases in the cycle corresponding to the clock frequency f2, and further produces a clock signal CLKF (second clock signal) based on the signal STP and the cycle signal RAMP2, as shown in FIG. 3.

The cycle signal RAMP2 is a signal having a waveform formed of a single shape cyclically repeated at the clock frequency f2. The voltage level of the cycle signal RAMP2 monotonously increases in one cycle (each cycle) of the reference clock signal CK2. That is, the voltage level monotonously increases between the same-kind edges of the reference clock signal CK2 (between rising edges or falling edges, for example). The cycle signal RAMP2 is, for example, a ramp-wave signal having a linearly increasing voltage level, as shown in FIG. 3, but not necessarily, and the voltage level may monotonously increase along a curve as long as the waves in all cycles have the same shape. FIG. 3 shows the case where the voltage level of the cycle signal RAMP2 monotonously increases in each cycle of the reference clock signal CK2, and the voltage level of the cycle signal RAMP2 may instead monotonously decrease in each cycle of the reference clock signal CK2. Further, FIG. 3 shows a case where the phase of the reference clock signal CK2 coincides with the phase of the cycle signal RAMP2, but the phase of the reference clock signal CK2 may not coincide with the phase of the cycle signal RAMP2. That is, the voltage level of the cycle signal RAMP2 may start monotonously increasing or decreasing at a timing (phase) shifted from an edge of the reference clock signal CK2.

The clock signal CLKF is a clock signal having the same frequency as that of the clock frequency f2, and the clock signal generation circuit 70 starts generating the clock signal CLKF based on the transition timing of the signal STP. Specifically, the phase difference between the reference clock signal CK2 and the clock signal CLKF is the inter-edge phase difference between the reference clock signal CK2 and the signal STP (between rising edges or falling edges, for example). The generation of the clock signal CLKF is achieved by using the fact that the voltage level of the cycle signal RAMP2 monotonously increases in each cycle of the reference clock signal CK2.

The processing circuit 80 converts the time difference between the transition timing of the signal STA and the transition timing of the signal STP into the digital value DQ based on the clock signals CLKS and CLKF. For example, assume that the first edge of the clock signal CLKS is generated at the transition timing of the signal STA, and that the first edge of the clock signal CLKF is generated at the transition timing of the signal STP. In this case, the phase difference between the first edges of the clock signals CLKS and CLKF is equal to the time difference between the transition timings of the signals STA and STP. Since the inter-edge time difference between the clock signals CLKS and CLKF is decremented by Δt, the time difference can be determined by counting the number of clocks until the order of the edges of the clock signal CLKS and the edges of the clock signal CLKF is reversed and multiplying the count by Δt. In the example shown in FIG. 3, the clock signal CLKS is ahead of the clock signal CLKF until the third clock of the clock signal CLKS, and the clock signal CLKF is ahead of the clock signal CLKS at the fourth clock. In this case, 3×Δt or 4×Δt is the time difference between the transition timing of the signal STA and the transition timing of the signal STP.

According to the embodiment described above, the reference clock signals CK1 and CK2 do not start oscillating at the transition timings of the signals STA and STP but are continuously oscillating clock signals externally inputted to the time-to-digital converter 20. In the present embodiment, the thus configured reference clock signals CK1 and CK2 can be used to measure the time difference between the transition timings of the signals STA and STP inputted externally to the time-to-digital converter 20 (produced at arbitrary timings). The reference clock signals CK1 and CK2, which are each generated by using an oscillator having excellent oscillation characteristics (jitter characteristic and process variation, for example), for example, a quartz crystal resonator, can therefore be used to measure time, whereby the performance of the time-to-digital converter can be increased. That is, the measurement can be not only performed at the time resolution (Δt) corresponding to the frequency difference between the reference clock signals CK1 and CK2 but performed accurately (with small amount of error or variation) by using the reference clock signals CK1 and CK2 having excellent characteristics.

Specifically, producing the cycle signal RAMP1, the voltage level of which monotonously increases or decreases in each cycle of the reference clock signal CK1, allows generation of the clock signal CLKS, the phase of which is shifted from the phase of the reference clock signal CK1 by the inter-edge phase difference between the reference clock signal CK1 and the signal STA. Similarly, producing the cycle signal RAMP2, the voltage level of which monotonously increases or decreases in each cycle of the reference clock signal CK2, allows generation of the clock signal CLKF, the phase of which is shifted from the phase of the reference clock signal CK2 by the inter-edge phase difference between the reference clock signal CK2 and the signal STP. The time difference between the transition timing of the signal STA and the transition timing of the signal STP can be measured based on the clock signals CLKS and CLKF.

Further, in the present embodiment, the clock signal generation circuit 60 generates the clock signal CLKS, the frequency of which is equal to the clock frequency f1 and the phase of which is set with reference to the transition timing of the signal STA, based on the signal STA and the cycle signal RAMP1. The clock signal generation circuit 70 generates the clock signal CLKF, the frequency of which is equal to the clock frequency f2 and the phase of which is set with reference to the transition timing of the signal STP, based on the signal STP and the cycle signal RAMP2.

Specifically, the clock signal generation circuit 60 generates the clock signal CLKS based on the voltage level (threshold voltage Vths) of the cycle signal RAMP1 at the transition timing of the signal STA. That is, the clock signal generation circuit 60 compares the voltage level (threshold voltage Vths) with the voltage level of the cycle signal RAMP1 to generate the clock signal CLKS. The clock signal generation circuit 70 generates the clock signal CLKF based on the voltage level (threshold voltage Vthf) of the cycle signal RAMP2 at the transition timing of the signal STP. That is, the clock signal generation circuit 70 compares the voltage level (threshold voltage Vthf) with the voltage level of the cycle signal RAMP2 to generate the clock signal CLKF.

As described above, the configuration in which the voltage level of the cycle signal RAMP1 monotonously increases or decreases in the cycle corresponding to the clock frequency f1 allows generation of the clock signal CLKS, the frequency of which is equal to the clock frequency f1 and the phase of which is set with reference to the transition timing of the signal STA. Similarly, the configuration in which the voltage level of the cycle signal RAMP2 monotonously increases or decreases in the cycle corresponding to the clock frequency f2 allows generation of the clock signal CLKF, the frequency of which is equal to the clock frequency f2 and the phase of which is set with reference to the transition timing of the signal STP.

2. Clock Signal Generation Circuit

Figure 4:
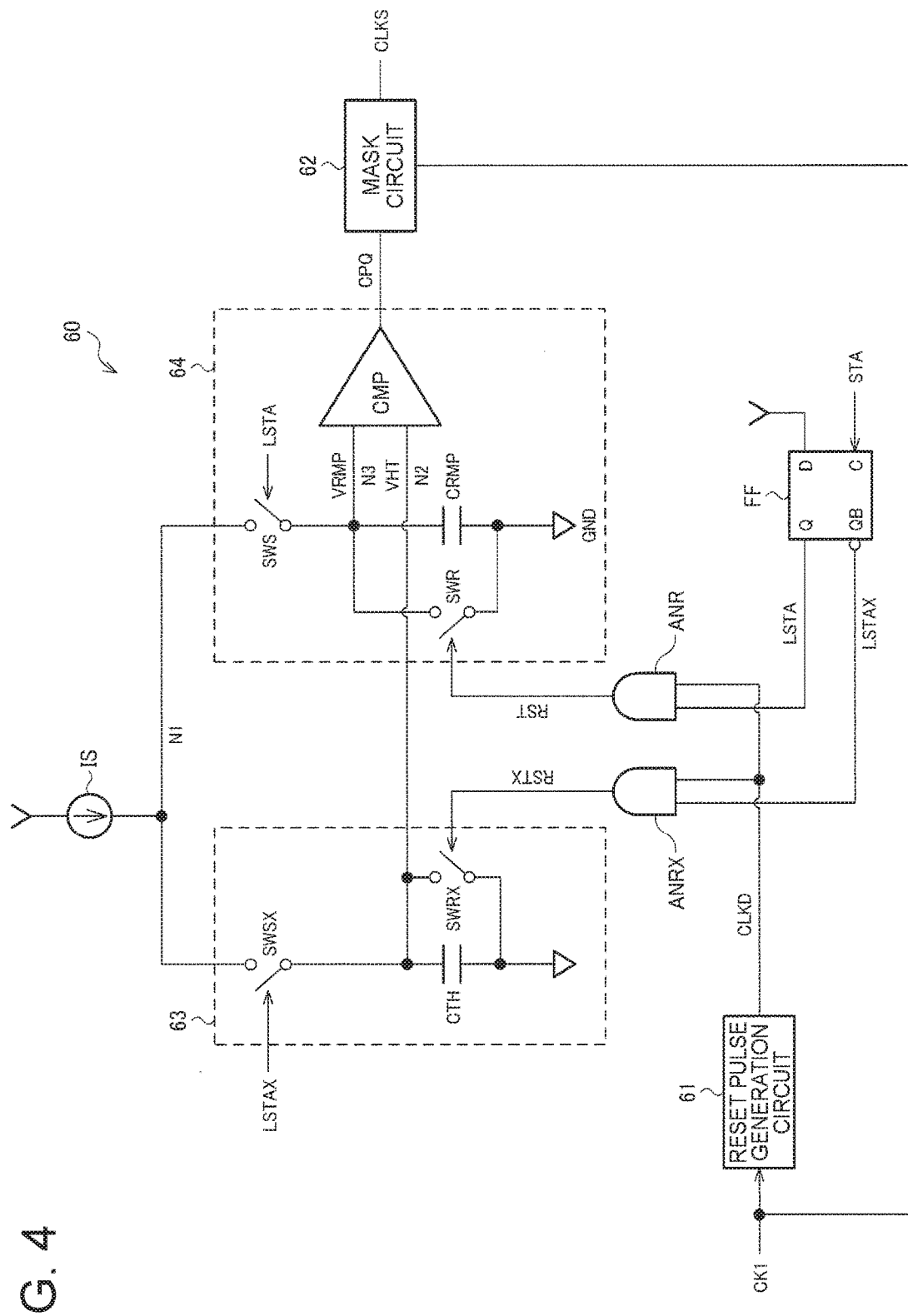
FIG. 4 is an example of the configuration of a clock signal generation circuit.
Figure 5:
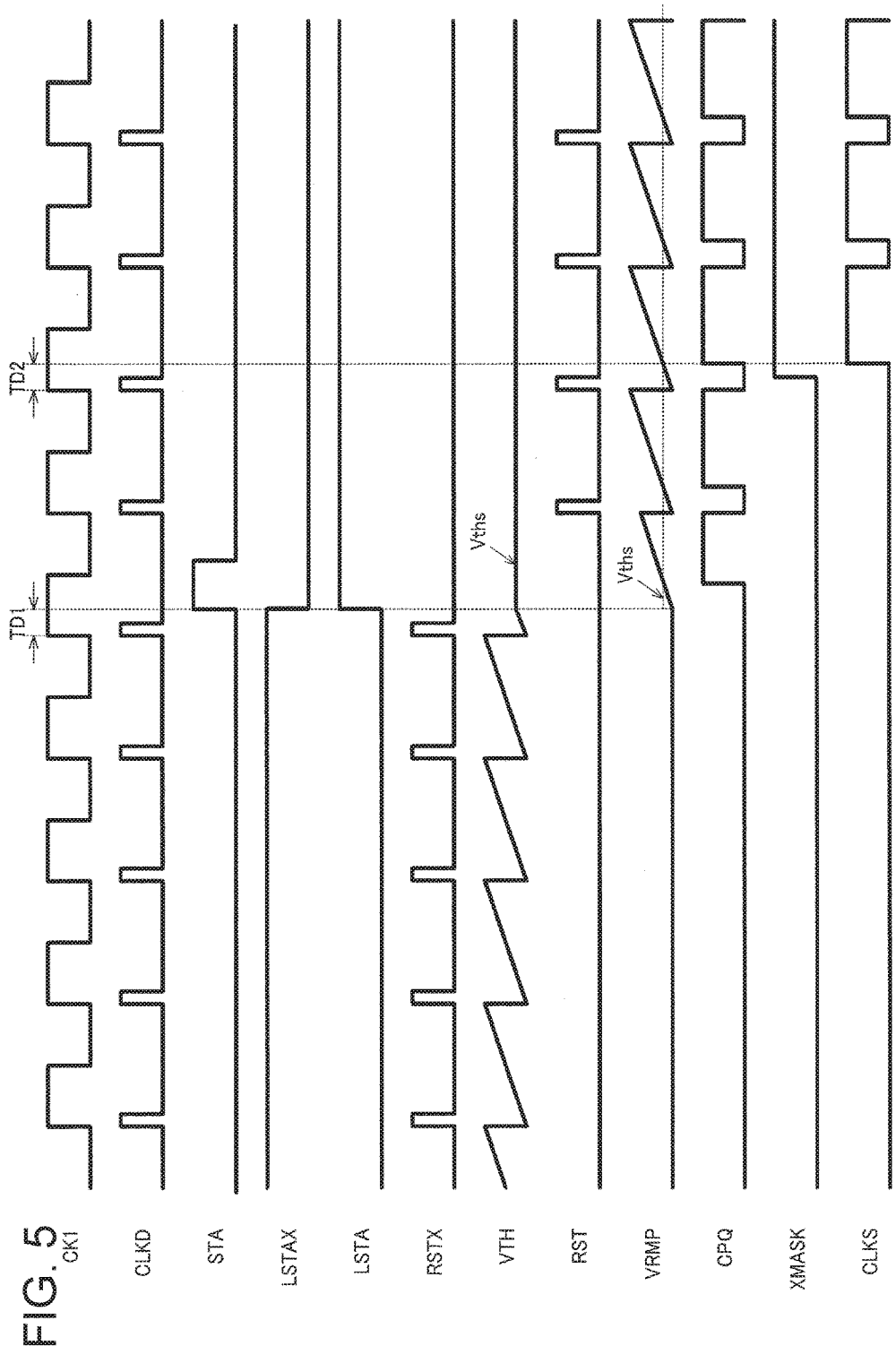
FIG. 5 is a timing chart for describing the action of the clock signal generation circuit.

FIG. 4 is an example of the configuration of the clock signal generation circuit. FIG. 5 is a timing chart for describing the action of the clock signal generation circuit. In FIGS. 4 and 5, the description will be made of the clock signal generation circuit 60, and it is noted that the clock signal generation circuit 70 has the same configuration. That is, in the case of the clock signal generation circuit 70, the reference clock signal CK1, the signal STA, the clock signal CLKS, and the threshold voltage Vths may be replaced with the reference clock signal CK2, the signal STP, the clock signal CLKF, and the threshold voltage Vthf, respectively.

The clock signal generation circuit 60 includes a holding circuit 63, a comparison circuit 64, a reset pulse generation circuit 61 (differential pulse generation circuit), a mask circuit 62, a current source IS, logical product circuits ANR and ANRX, and a flip-flop circuit FF (latch circuit).

The current source IS outputs a fixed current ICH, the current value of which does not change over time, to a node N1. The current source IS is formed, for example, of a current mirror circuit. For example, the circuit device 10 includes a reference current generation circuit that is not shown, and the current mirror circuit mirrors a reference current supplied from the reference current generation circuit to generate the fixed current ICH. The fixed current ICH may have a fixed value or may be set to be variable. For example, the mirror ratio of the current mirror circuit may be variably set.

The reset pulse generation circuit 61 generates a reset pulse signal CLKD based on the reference clock signal CK1. The reset pulse signal CLKD is a differential pulse signal generated by differentiating the reference clock signal CK1, as shown in FIG. 5. Specifically, the reset pulse signal CLKD is a differential pulse signal outputted at each rising edge of the reference clock signal CK1.

The flip-flop circuit FF latches the high level at a rising edge (transition timing) of the signal STA and outputs a latched signal LSTA and a signal LSTAX, which is the logically inverted signal of the signal LSTA. The logical product circuit ANR outputs a reset signal RST in the form of the logical product of the signal LSTA and the reset pulse signal CLKD. The reset signal RST is the reset pulse signal CLKD outputted after a rising edge of the signal STA, as shown in FIG. 5. The logical product circuit ANRX outputs a reset signal RSTX in the form of the logical product of the signal LSTAX and the reset pulse signal CLKD. The reset signal RSTX is the reset pulse signal CLKD outputted before a rising edge of the signal STA, as shown in FIG. 5.

The holding circuit 63 includes a switch element SWSX, which is provided between the node N1 and a node N2, a capacitor CTH, which is provided between the node N2 and a power source node GND (low-potential-side power source node), and a switch element SWRX, which is provided between the node N2 and the power source node GND. The switch elements SWSX and SWRX (switches) are each, for example, a transistor.

The switch element SWSX is off when the signal LSTAX has the low level (first logic level) and is on when the signal LSTAX has the high level (second logic level). The switch element SWRX is off when the reset signal RSTX has the low level and is on when the reset signal RSTX has the high level. Since the signal LSTAX has the high level before the rising edge of the signal STA, as shown in FIG. 5, the switch element SWSX is on, and the fixed current ICH charges the capacitor CTH. When a pulse of the reset signal RSTX is inputted, the switch element SWRX is turned on so that the opposite ends of the capacitor CTH form a short circuit, and the charge in the capacitor CTH is reset. In the periods between the pulses of the reset signal RSTX, the switch element SWRX is off so that the capacitor CTH is charged, and a voltage VTH at the node N2 increases. The voltage VTH at the node N2 thus forms a ramp wave.

Since the signal LSTAX goes to the low level at the rising edge of the signal STA, the switch element SWSX is turned off. After the rising edge of the signal STA, the reset signal RSTX has no pulse. Therefore, the electric charge charged in the capacitor CTH at the rising edge of the signal STA is held in the capacitor CTH, and the voltage VTH at the node N2 at the rising edge of the signal STA is held. The held voltage is used as the threshold voltage Vths (first threshold voltage).

The comparison circuit 64 includes a switch element SWS, which is provided between the node N1 and a node N3, a capacitor CRMP, which is provided between the node N3 and the power source node GND, a switch element SWR, which is provided between the node N2 and the power source node GND, and a comparator CMP. A first input terminal (positive terminal, for example) of the comparator CMP is connected to the node N3, and a second input terminal (negative terminal, for example) of the comparator CMP is connected to the node N2. The switch elements SWS and SWR (switches) are each, for example, a transistor.

The switch element SWS is off when the signal LSTA has the low level (first logic level) and is on when the signal LSTA has the high level (second logic level). The switch element SWR is off when the reset signal RST has the low level and is on when the signal RST has the high level. Since the signal LSTA has the low level before the rising edge of the signal STA, as shown in FIG. 5, the switch element SWS is off, and the capacitor CRMP is not charged. A voltage VRMP at the node N3 is fixed (0 V, for example).

Since the signal LSTA goes to the high level at the rising edge of the signal STA, the switch element SWS is turned on, and the fixed current ICH charges the capacitor CTH. When a pulse of the reset signal RST is inputted, the switch element SWR is turned on so that the opposite ends of the capacitor CRMP form a short circuit, and the charge in the capacitor CRMP is reset. In the periods between the pulses of the reset signal RST, the switch element SWR is off so that the capacitor CRMP is charged, and the voltage VRMP at the node N3 increases. The voltage VRMP at the node N3 thus forms a ramp wave. The ramp wave having the voltage VTH before the rising edge of the signal STA and the ramp wave having the voltage VRMP after the rising edge of the signal STA correspond to the cycle signal RAMP1 in FIG. 1.

The comparator CMP compares the threshold voltage Vths with the voltage VRMP of the ramp wave and outputs the result of the comparison as an output signal CPQ. For example, when VRMP<Vths, the output signal CPQ has the low level, whereas when VRMP>Vths, the output signal CPQ has the high level. Since the threshold voltage Vths is the voltage of the ramp wave at the rising edge of the signal STA, the phase of the edges of the output signal CPQ reflects the phase of the edge of the signal STA. That is, a phase difference TD1 between an edge of the reference clock signal CK1 and the edge of the signal STA is equal (or roughly equal) to a phase difference TD2 between an edge of the reference clock signal CK1 and an edge of the output signal CPQ. It is noted that the phase of the first pulse of the output signal CPQ does not necessarily reflect the phase of the edge of the signal STA.

The mask circuit 62 masks the first one or plurality of pulses of the output signal CPQ from the comparator CMP and outputs the masked signal as the clock signal CLKS. The mask circuit 62 generates a mask signal XMASK based on the signal LSTA and the reset pulse signal CLKD and uses the mask signal XMASK to mask the output signal CPQ. In FIG. 5, the first two pulses of the output signal CPQ are masked, but not necessarily.

Figure 6:
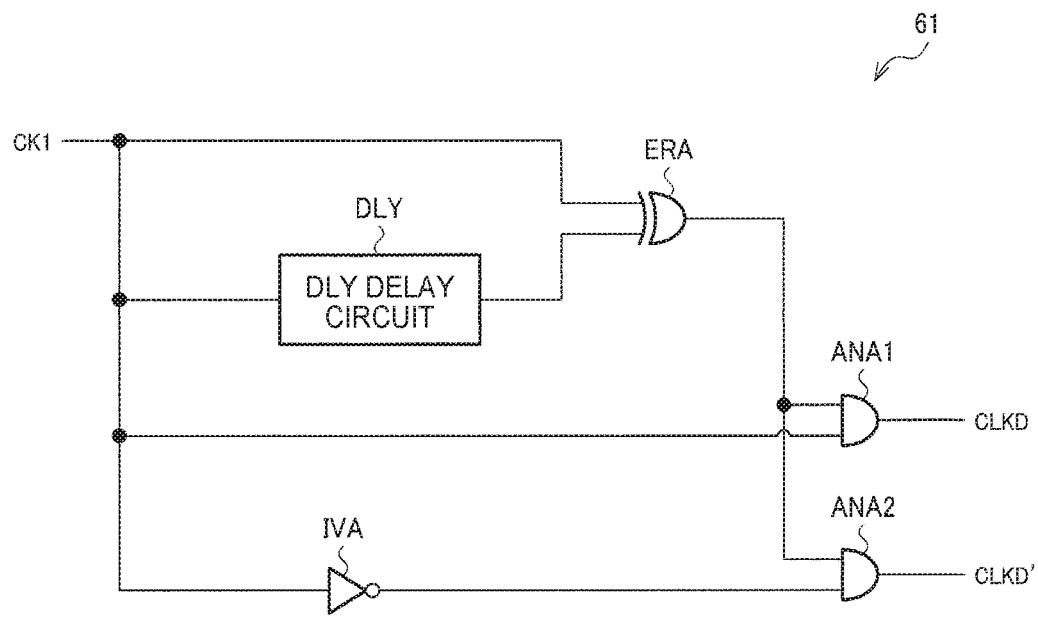
FIG. 6 is an example of the configuration of a reset pulse generation circuit.

FIG. 6 is an example of the configuration of the reset pulse generation circuit. The reset pulse generation circuit 61 includes a delay circuit DLY, an exclusive logical sum circuit ERA, logical product circuits ANA1 and ANA2, and a logical inversion circuit IVA.

The delay circuit DLY is formed, for example, of an odd number of logical inversion circuits connected to each other in series and delays the reference clock signal CK1. The exclusive logical sum circuit ERA outputs the exclusive logical sum of the reference clock signal CK1 and the delayed reference clock signal CK1. The logical product circuit ANA1 outputs the reset pulse signal CLKD in the form of the logical product of the reference clock signal CK1 and the output signal from the exclusive logical sum circuit ERA. The reset pulse signal CLKD is a differential pulse signal outputted at a rising edge of the reference clock signal CK1. The logical inversion circuit IVA logically inverts the reference clock signal CK1 and outputs the inverted signal. The logical product circuit ANA2 outputs a reset pulse signal CLKD' in the form of the logical product of the output signal from the logical inversion circuit IVA and the output signal from the exclusive logical sum circuit ERA. The reset pulse signal CLKD' is a differential pulse signal outputted at a falling edge of the reference clock signal CK1. The reset pulse signal CLKD' is used by a clock signal generation circuit 65, which will be described later with reference, for example, to FIG. 10.

Figure 7:
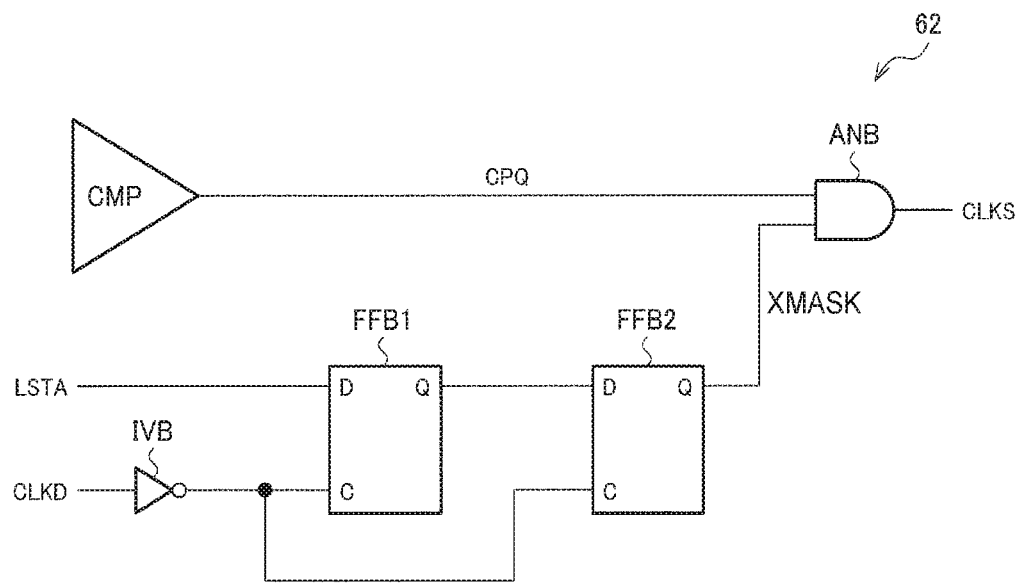
FIG. 7 is an example of the configuration of a mask circuit.

FIG. 7 is an example of the configuration of the mask circuit. The mask circuit 62 includes flip-flop circuits FFB1 and FFB2 (latch circuits), a logical product circuit ANB, and a logical inversion circuit IVB.

The logical inversion circuit IVB logically inverts the reset pulse signal CLKD and outputs the inverted signal. The flip-flop circuits FFB1 and FFB2 operate in response to the output signal from the logical inversion circuit IVB as a clock signal, delay the signal LSTA by the amount corresponding to two falling edges of the reset pulse signal CLKD, and outputs the delayed signal as the mask signal XMASK. The logical product circuit ANB outputs the clock signal CLKS in the form of the logical product of the output signal CPQ from the comparator CMP and the mask signal XMASK.

According to the embodiment described above, the clock signal generation circuit 60 includes the holding circuit 63 (first holding circuit), which holds the voltage level of the cycle signal RAMP1 (voltage VTH) at the transition timing of the signal STA as the threshold voltage Vths, and the comparison circuit 64, which compares the threshold voltage Vths with the voltage level of the cycle signal RAMP1 (voltage VRMP) and outputs the clock signal CLKS. Similarly, the clock signal generation circuit 70 includes a second holding circuit that holds the voltage level of the cycle signal RAMP2 at the transition timing of the signal STP as the threshold voltage Vthf and a second comparison circuit that compares the threshold voltage Vthf with the voltage level of the cycle signal RAMP2 and outputs the clock signal CLKF.

The configuration described above allows the phase difference TD1 between an edge of the reference clock signal CK1 and the edge of the signal STA to be equal to the phase difference TD2 between an edge of the reference clock signal CK1 and an edge of the clock signal CLKS. That is, the clock signal CLKS, the phase of which is set with reference to the transition timing of the signal STA, can be produced based on the signal STA and the cycle signal RAMP1. The configuration described above further allows the phase difference between an edge of the reference clock signal CK2 and the edge of the signal STP to be equal to the phase difference between an edge of the reference clock signal CK2 and an edge of the clock signal CLKF. That is, the clock signal CLKF, the phase of which is set with reference to the transition timing of the signal STP, can be produced based on the signal STP and the cycle signal RAMP2.

In the present embodiment, the clock signal generation circuit 60 includes the mask circuit 62 (first mask circuit), which masks the first one or plurality of pulses of the clock signal CLKS. Similarly, the clock signal generation circuit 70 includes a second mask circuit that masks the first one or plurality of pulses of the clock signal CLKF.

The phase of the first pulse of the output signal CPQ from the comparator CMP does not necessarily reflect the phase of the edge of the signal STA, as described with reference to FIG. 5. According to the present embodiment, an unstable pulse, such as the first pulse, is masked, whereby the clock signal CLKS that reflects the phase of the edge of the signal STA can be outputted. Similarly, the clock signal CLKF that reflects the phase of the edge of the signal STP can be outputted.

3. Processing Circuit

Figure 8:
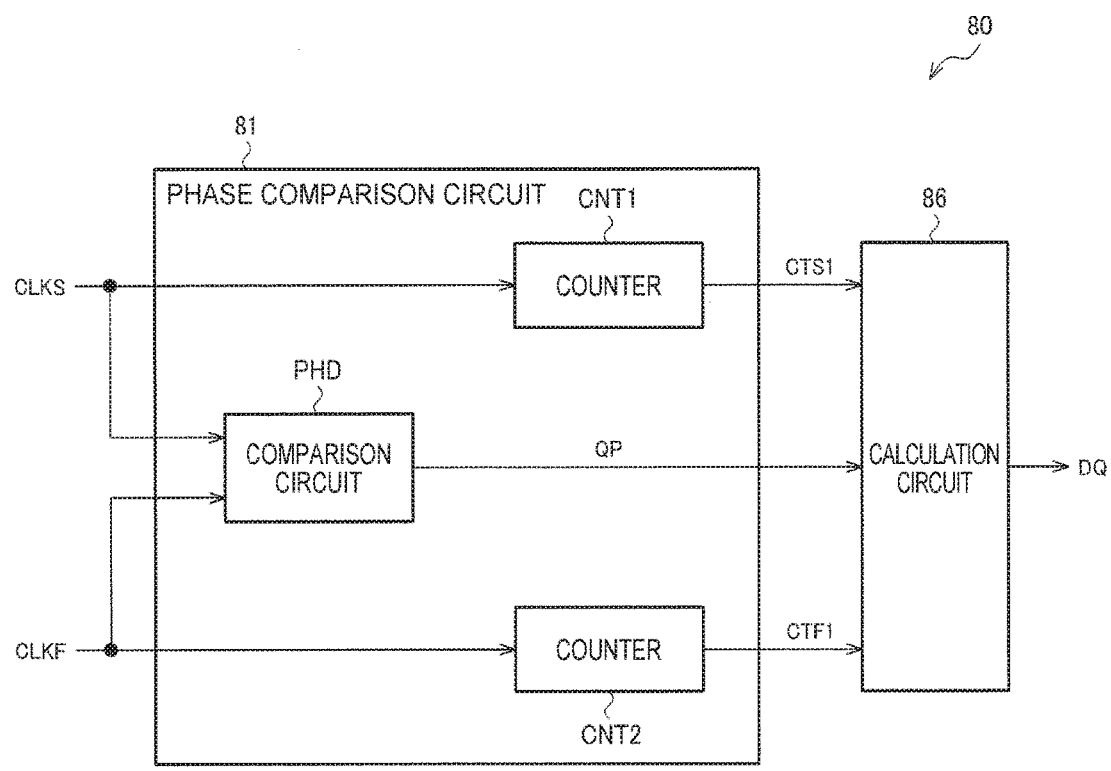
FIG. 8 shows an example of the configuration of a processing circuit.
Figure 9:
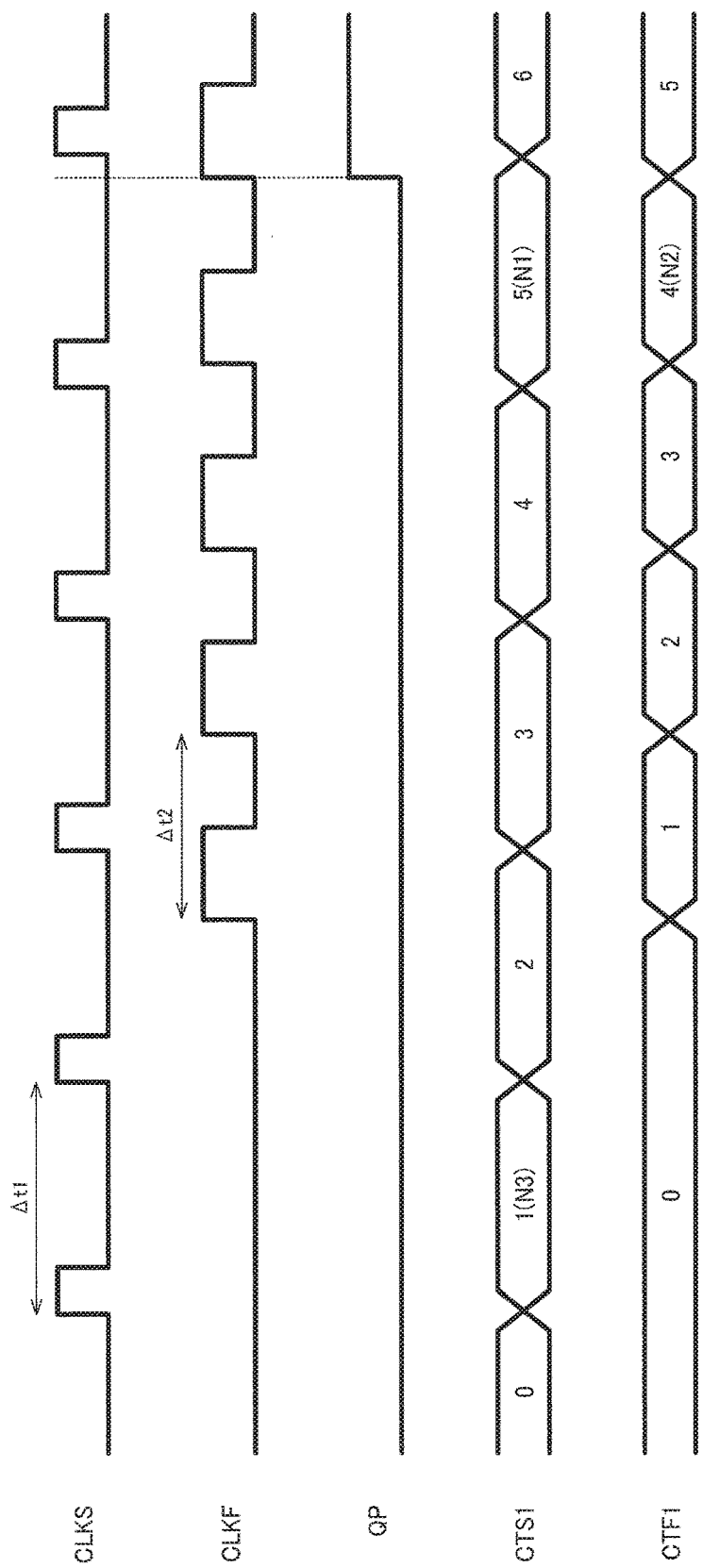
FIG. 9 is a timing chart for describing the action of the processing circuit.

FIG. 8 shows an example of the configuration of the processing circuit. FIG. 9 is a timing chart for describing the action of the processing circuit. The processing circuit 80 includes a phase comparison circuit 81 (first phase comparison circuit) and a calculation circuit 86, as shown in FIG. 8.

The phase comparison circuit 81 compares the phase of the clock signal CLKS and the phase of the clock signal CLKF. The processing circuit 80 outputs the digital value DQ of the time difference between the transition timing of the signal STA and the transition timing of the signal STP based on the result of the phase comparison.

Specifically, the phase comparison circuit 81 includes counters CNT1 and CNT2 and a comparison circuit PHD. The counter CNT1 counts the number of clocks of the clock signal CLKS and outputs a count CTS1, which is the result of the counting. The counter CNT2 counts the number of clocks of the clock signal CLKF and outputs a count CTF1, which is the result of the counting. The comparison circuit PHD compares an edge timing of the clock signal CLKS (transition timing, for example, timing of rising edge) with an edge timing of the clock signal CLKF (transition timing, for example, timing of rising edge) and outputs the result of the comparison as an output signal QP. For example, when the edge timing of the clock signal CLKS is ahead of the edge timing of the clock signal CLKF, the output signal QP has the low level. When the edge timing of the clock signal CLKF is ahead of the edge timing of the clock signal CLKS, the output signal QP has the high level.

The calculation circuit 86 determines the digital value DQ of the time difference based on the counts CTS1 and CTF1 and the output signal QP from the comparison circuit PHD. The calculation circuit 86 is formed of a logic circuit. An example of the calculation of determining the digital value DQ will be described with reference to FIG. 9. The calculation method is not limited to the method described below. A count CTS1 (=N1) and a count CTS2 (=N2) at the rising edge (transition timing) of the output signal QP from the comparison circuit PHD are acquired, as shown in FIG. 9. Let $\Delta t1$ (=1/f1) be the cycle of the clock signal CLKS and $\Delta t2$ (=1/f2) be the cycle of the clock signal CLKF, and the difference between the two cycles is the resolution $\Delta t=|\Delta t1-\Delta t2|$. Let N3 to be N1−N2, and the calculation circuit 86 determines the time difference between the transition timing of the signal STA and the transition timing of the signal STP by N3×$\Delta t1$+N2×$\Delta t$. In the example shown in FIG. 9, since N1=5, N2=4, and N3=1, the time difference is $\Delta t1$+4×$\Delta t$.

According to the embodiment described above, comparison between the phase of the clock signal CLKS and the phase of the clock signal CLKF allows detection of whether the order of the edges of the clock signal CLKS and the edges of the clock signal CLKF is reversed. The time difference between the transition timing of the signal STA and the transition timing of the signal STP can be determined based on the number of clocks of the clock signals CLKS and CLKF until the change occurs.

4. Second Example of Configuration of Time-to-Digital Converter

Figure 10:
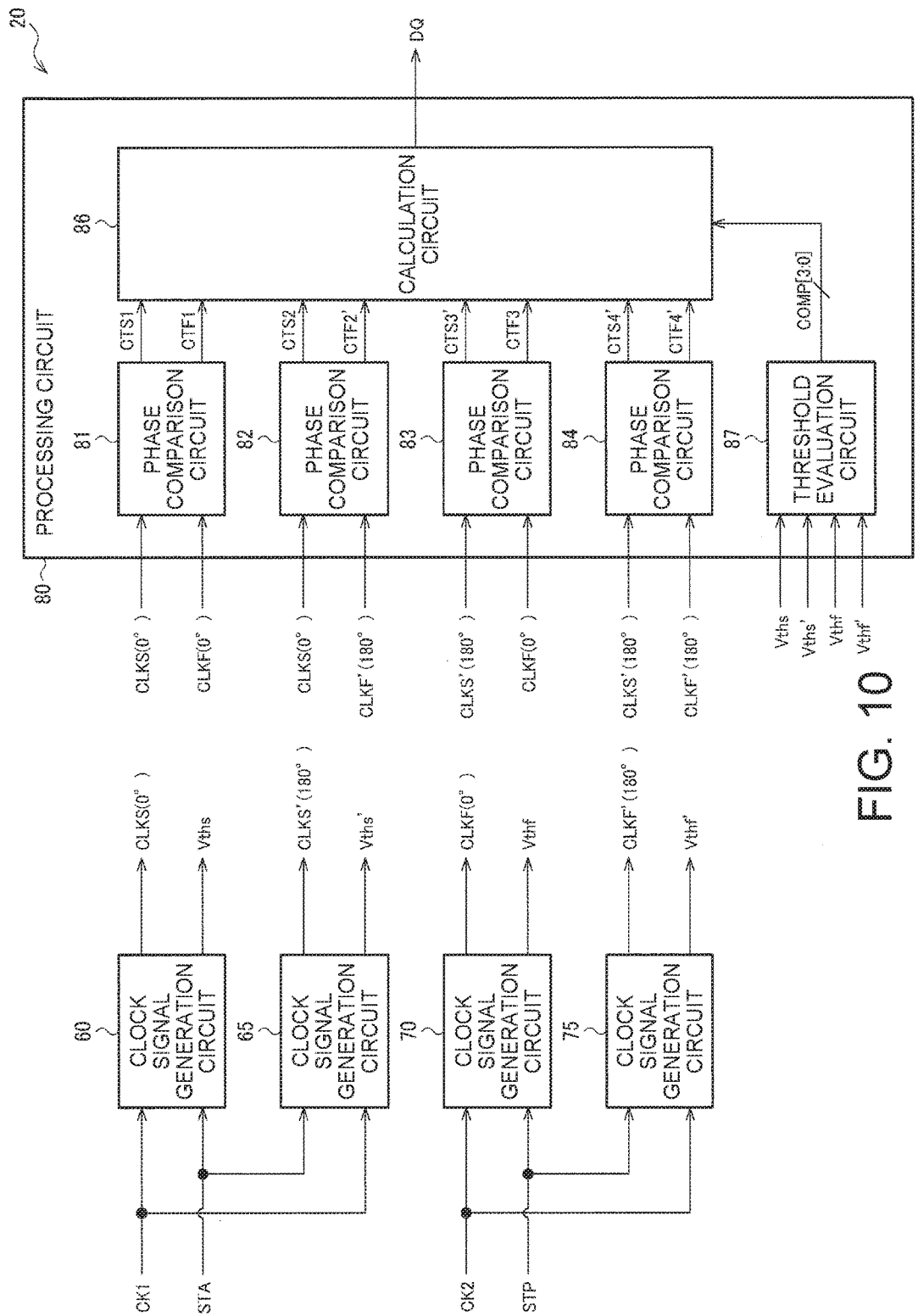
FIG. 10 shows a second example of the configuration of the time-to-digital converter according to the embodiment.
Figure 11:
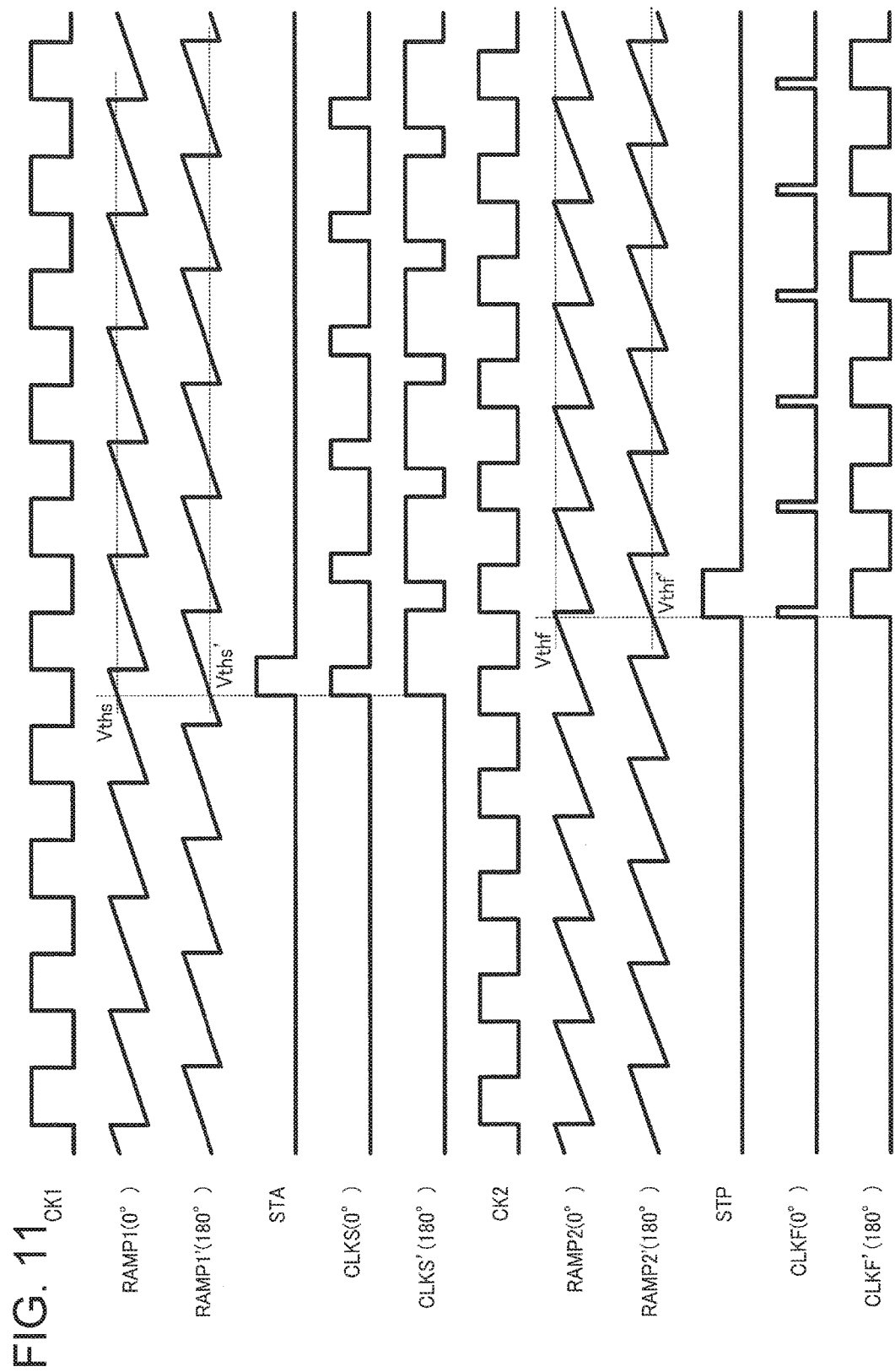
FIG. 11 is a timing chart for describing the action of the time-to-digital converter having the configuration of the second example.

FIG. 10 shows a second example of the configuration of the time-to-digital converter according to the present embodiment. FIG. 11 is a timing chart for describing the action of the time-to-digital converter having the configuration of the second example.

The time-to-digital converter 20 includes the clock signal generation circuit 60, the clock signal generation circuit 70, a clock signal generation circuit 65 (third clock signal generation circuit), a clock signal generation circuit 75 (fourth clock signal generation circuit), and the processing circuit 80, as shown in FIG. 10. The same components as those having been already described have the same reference characters, and no description of the same components will be made as appropriate.

The reference clock signal CK1 having the clock frequency f1 is inputted to the clock signal generating circuit 65. The clock signal generating circuit 65 generates a cycle signal RAMP1', the voltage level of which monotonously increases in one cycle (each cycle) of the reference clock signal CK1, and generates a clock signal CLKS' (third clock signal) based on the signal STA and the cycle signal RAMP1', as shown in FIG. 11. The cycle signal RAMP1' differs in phase from the cycle signal RAMP1. Specifically, the cycle signal RAMP1' differs in phase from the cycle signal RAMP1 by 180 degrees. The clock signal generating circuit 65 uses the reset pulse signal (reset pulse signal CLKD' in FIG. 6) that generates pulses at the falling edges of the reference clock signal CK2, and the voltage level of the cycle signal RAMP1' monotonously increases between the falling edges of the reference clock signal CK1. The voltage level of the cycle signal RAMP1' may instead monotonously decrease between the falling edges of the reference clock signal CK1.

The reference clock signal CK2 having the clock frequency f2 is inputted to the clock signal generating circuit 75. The clock signal generating circuit 75 generates a cycle signal RAMP2', the voltage level of which monotonously increases in one cycle (each cycle) of the reference clock signal CK2, and generates a clock signal CLKF' (fourth clock signal) based on the signal STP and the cycle signal RAMP2', as shown in FIG. 11. The cycle signal RAMP2' differs in phase from the cycle signal RAMP2. Specifically, the cycle signal RAMP2' differs in phase from the cycle signal RAMP2 by 180 degrees. The clock signal generating circuit 75 uses a reset pulse signal that generates pulses at the falling edges of the reference clock signal CK2, and the voltage level of the cycle signal RAMP2' monotonously increases between the falling edges of the reference clock signal CK2. The voltage level of the cycle signal RAMP2' may instead monotonously decrease between the falling edges of the reference clock signal CK2.

Since the signal STA having an arbitrary phase is inputted (the signal STA is inputted at an arbitrary timing) with respect to the reference clock signal CK1, the cycle signal RAMP1 and the signal STA each have an arbitrary phase. There is a possibility of no appropriate generation of the clock signal CLKS. Similarly, since the signal STP having an arbitrary phase is inputted (the signal STP is inputted at an arbitrary timing) with respect to the reference clock signal CK2, there is a possibility of no appropriate generation of the clock signal CLKF. For example, in the example shown in FIG. 11, since the phase difference between the reference clock signal CK2 and the signal STP is small, the clock signal CLKF is undesirably a narrow-width pulse signal, and a downstream circuit (phase comparison circuit, for example) is likely to malfunction. Further, since the comparator compares the cycle signal with the threshold voltage, as described with reference to FIG. 4, there is a possibility of inappropriate output of the clock signal CLKS or CLKF if the threshold voltage does not fall within an input voltage range over which the comparator can appropriately operate.

In this regard, the present embodiment allows generation of the cycle signals RAMP1 and RAMP1' that synchronize with the reference clock signal CK1 and differ in phase from each other. The clock signal CLKS can therefore be appropriately generated. That is, since the cycle signals RAMP1 and RAMP1' differ in phase from each other, the phase difference between the signal STA and the cycle signal RAMP1 differs from the phase difference between the signal STA and the cycle signal RAMP1'. Either of the clock signals CLKS and CLKS' is therefore likely to be appropriately generated. Similarly, since the present embodiment allows generation of the cycle signals RAMP2 and RAMP2' that synchronize with the reference clock signal CK2 and differ in phase from each other, either of the clock signals CLKF and CLKF' is likely to be appropriately generated.

Further, in the present embodiment, the processing circuit 80 includes the phase comparison circuit 81, a phase comparison circuit 82 (second phase comparison circuit), a phase comparison circuit 83 (third phase comparison circuit), a phase comparison circuit 84 (fourth phase comparison circuit), the calculation circuit 86, and a threshold evaluation circuit 87. The phase comparison circuits 82 to 84 can be configured in the same manner as is the phase comparison circuit 81.

The phase comparison circuit 81 compares the phase of the clock signal CLKS with the phase of the clock signal CLKF. Specifically, the phase comparison circuit 81 detects the timing when the order of the edges of the clock signal CLKS and the edges of the clock signal CLKF is reversed and outputs the count CTS1 representing the number of clocks of the clock signal CLKS at the timing of the change and the count CTF1 representing the number of clocks of the clock signal CLKF at the timing of the change.

The phase comparison circuit 82 compares the phase of the clock signal CLKS with the phase of the clock signal CLKF'. Specifically, the phase comparison circuit 82 detects the timing when the order of the edges of the clock signal CLKS and the edges of the clock signal CLKF' is reversed and outputs the count CTS2 representing the number of clocks of the clock signal CLKS at the timing of the change and a count CTF2' representing the number of clocks of the clock signal CLKF' at the timing of the change.

The phase comparison circuit 83 compares the phase of the clock signal CLKS' with the phase of the clock signal CLKF. Specifically, the phase comparison circuit 83 detects the timing when the order of the edges of the clock signal CLKS' and the edges of the clock signal CLKF is reversed and outputs a count CTS3' representing the number of clocks of the clock signal CLKS' at the timing of the change and a count CTF3 representing the number of clocks of the clock signal CLKF at the timing of the change.

The phase comparison circuit 84 compares the phase of the clock signal CLKS' with the phase of the clock signal CLKF'. Specifically, the phase comparison circuit 84 detects the timing when the order of the edges of the clock signal CLKS' and the edges of the clock signal CLKF' is reversed and outputs the count CTS4' representing the number of clocks of the clock signal CLKS' at the timing of the change and a count CTF4' representing the number of clocks of the clock signal CLKF' at the timing of the change.

The calculation circuit 86 (processing circuit 80) outputs the digital value DQ of the time difference between the transition timing of the signal STA and the signal STP based on the results of the phase comparison performed by the phase comparison circuits 82 to 84 (first to fourth phase comparison circuits). Now, CTS1 and CTF1 are called CT1, CTS2 and CTF2' are called CT2, CTS3' and CTF3 are called CT3, and CTS4' and CTF4' are called CT4. The calculation circuit 86 determines the digital value DQ of the time difference from at least one (one set) of CT1, CT2, CT3, and CT4. For example, the digital value DQ of the time difference is determined from CT1, CT2, CT3, or CT4. The method for calculating the time difference is the same method described with reference, for example, to FIG. 9.

According to the present embodiment, the phase comparison is performed on the four combinations between the clock signals CLKS and CLKS' and the clock signals CLKF and CLKF', and the digital value DQ of the time difference is determined based on the results of the phase comparison. The clock signals CLKS and CLKS' are generated based on the signal STA and the cycle signals RAMP1 and RAMP1', which differs in phase from each other, and the clock signals CLKF and CLKF' are generated based on the signal STP and the cycle signals RAMP2 and RAMP2', which differs in phase from each other. It is therefore expected that a combination of clock signals generated appropriately for the signals STA and STP generated at arbitrary timings is obtained by using at least one of the four combinations described above.

In the present embodiment, the clock signal generation circuit 60 includes the holding circuit 63 (first holding circuit) and the comparison circuit 64 (second comparison circuit), as described with reference to FIG. 4. The holding circuit 63 holds the threshold voltage Vths (first threshold voltage) in the form of the voltage level of the cycle signal RAMP1 at the transition timing of the signal STA, as shown in FIG. 11. The comparison circuit 64 compares the threshold voltage Vths with the voltage level of the cycle signal RAMP1 and outputs the clock signal CLKS.

The clock signal generation circuit 70 includes the second holding circuit and the second comparison circuit. The second holding circuit holds the threshold voltage Vthf (second threshold voltage) in the form of the voltage level of the cycle signal RAMP2 at the transition timing of the signal STP, as shown in FIG. 11. The second comparison circuit compares the threshold voltage Vthf with the voltage level of the cycle signal RAMP2 and outputs the clock signal CLKF.

The clock signal generation circuit 65 includes a third holding circuit and a third comparison circuit. The third holding circuit holds a threshold voltage Vths' (third threshold voltage) in the form of the voltage level of the cycle signal RAMP1' at the transition timing of the signal STA, as shown in FIG. 11. The third comparison circuit compares the threshold voltage Vths' with the voltage level of the cycle signal RAMP1' and outputs the clock signal CLKS'.

The clock signal generation circuit 75 includes a fourth holding circuit and a fourth comparison circuit. The fourth holding circuit holds a threshold voltage Vthf' (fourth threshold voltage) in the form of the voltage level of the cycle signal RAMP2' at the transition timing of the signal STP, as shown in FIG. 11. The fourth comparison circuit compares the threshold voltage Vthf' with the voltage level of the cycle signal RAMP2' and outputs the clock signal CLKF'.

The threshold evaluation circuit 87 evaluates whether or not the threshold voltages Vths, Vthf, Vths', and Vthf' (first to fourth threshold voltages) each fall within a given voltage range. The calculation circuit 86 (processing circuit 80) selects any of the results of the phase comparison (CT1 to CT4) performed by the phase comparison circuits 81 to 84 based on the result of the evaluation and uses the selected result of the phase comparison to evaluate whether the digital value DQ is determined.

Specifically, the threshold evaluation circuit 87 outputs the result of the evaluation in the form of a code value COMP[3:0]. The code value COMP[3:0] represents a voltage range to which a threshold voltage belongs and is outputted for each of t the threshold voltages Vths, Vthf, Vths', and Vthf'. For example, the range from 0 V to the power source voltage is divided into first to fifth voltage ranges, and COMP[3:0]="0000", "0001", "0011", "0111", and "1111" represents the first to fifth voltage ranges, respectively. The calculation circuit 86 selects a comparison result (any of CT1 to CT4) corresponding to the combination of the threshold voltage within a given voltage range out of the threshold voltages Vths and Vths' and the threshold voltage within a given voltage range out of the threshold voltages Vthf and Vthf'. For example, in a case where the given voltage ranges are the second and third voltage ranges, assume that COMP[3:0]="0001" for Vths and COMP[3:0]="0011" for Vthf. In this case, the calculation circuit 86 selects the counts CTS2 and CTS2' (CT2) outputted by the phase comparison circuit 82 and determines the digital value DQ of the time difference from the counts CTS2 and CTS2'.

The given voltage range is a voltage range suitable for the generation of the clock signal (CLKS, CLKS', CLKF, or CLKF'). For example, the given voltage range is the range from a voltage higher than the lower-limit voltage of the cycle signal (RAMP1, RAMP1', RAMP2, or RAMP2') to a voltage lower than the upper-limit voltage of the cycle signal. For example, the range of the voltage inputted to the comparator CMP (voltage range over which voltage comparison is allowed) described with reference to FIG. 4 is set as the given voltage range. Instead, an input voltage range where the comparator CMP has satisfactory operation characteristics (for example, comparator CMP can accurately compare voltages with each other) may be set as the given voltage range.

According to the present embodiment, the time difference between the transition timing of the signal STA and the transition timing of the signal STP can be determined from the clock signal generated by using the threshold voltage within the given voltage range. The digital value DQ of the time difference can therefore be determined based on an appropriately generated clock signal, whereby the time measurement can be performed with high quality (decrease in measurement error and improvement in measurement accuracy, for example).

Figure 12:
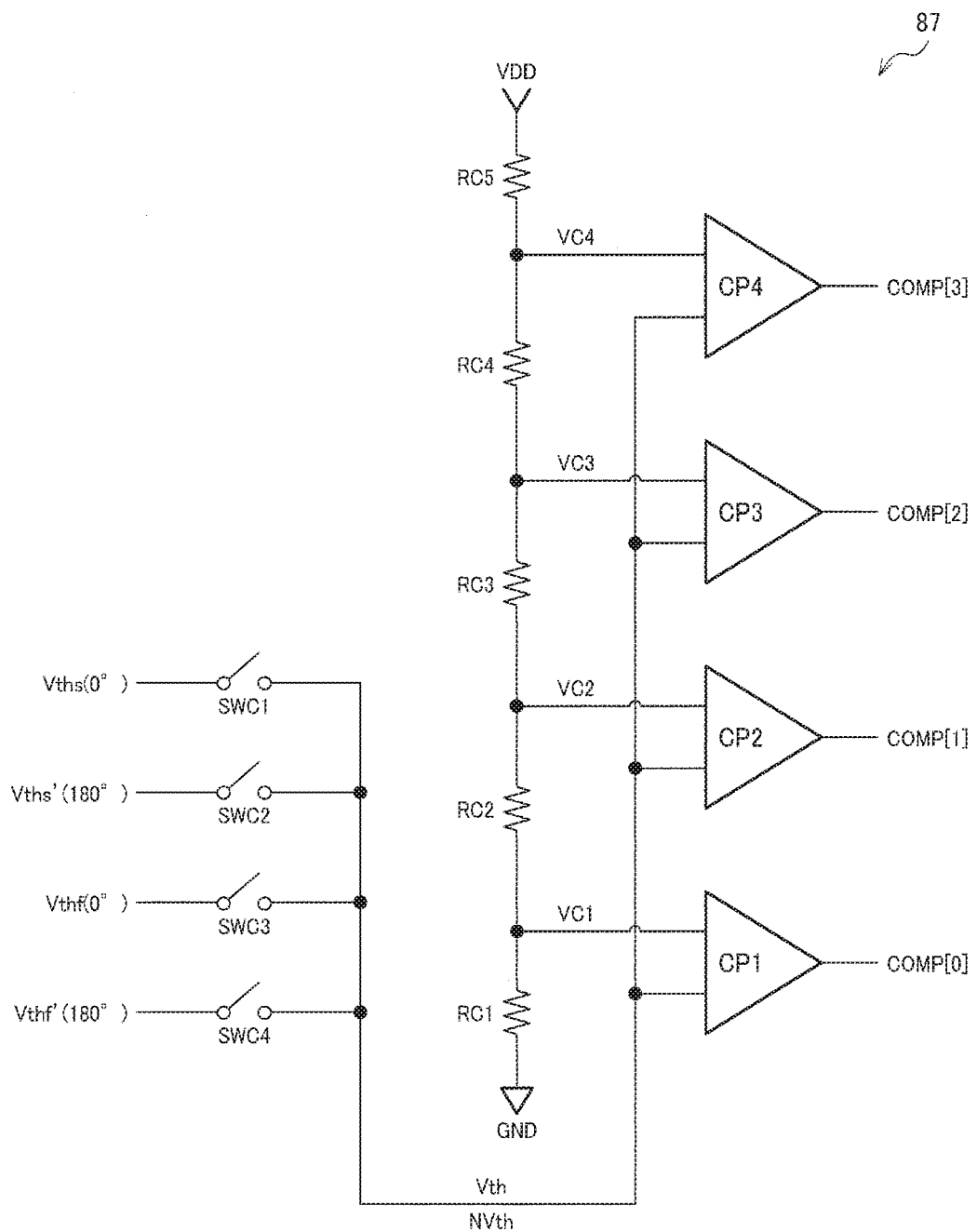
FIG. 12 shows an example of the configuration of a threshold evaluation circuit.

FIG. 12 shows an example of the configuration of the threshold evaluation circuit. The threshold evaluation circuit 87 includes switch elements SWC1 to SWC4, resistive elements RC1 to RC5 (resistors), and comparators CP1 to CP4.

The switch elements SWC1 to SWC4 select any one of the threshold voltages Vths, Vths', Vthf, and Vthf'. That is, any one of the switch elements SWC1 to SWC4 is turned on, and the threshold voltage inputted to the switch element is outputted as a voltage Vth to a node NVth. The resistive elements RC1 to RC5 are connected to each other in series between a power source node VDD (high-potential-side power source node) and the power source node GND (low-potential-side power source node). The voltage Vth is inputted to a first input terminal (positive terminal, for example) of the comparator CP1, and a voltage VC1 at the node between the resistive elements RC1 and RC2 is inputted to a second input terminal (negative terminal, for example) of the comparator CP1. Similarly, the voltage Vth is inputted to the first input terminal of each of the comparators CP2, CP3, and CP4, and voltages VC2, VC3, and VC4 are inputted to the second input terminals of the comparators CP2, CP3, and CP4, respectively. The voltage VC2 is the voltage at the node between the resistive elements RC2 and RC3. The voltage VC3 is the voltage at the node between the resistive elements RC3 and RC4. The voltage VC4 is the voltage at the node between the resistive elements RC4 and RC5. The comparators CP1 to CP4 compare the voltage Vth with the voltages VC1 to VC4 and output the results of the comparison in the form of COMP [0], COMP[1], COMP[2], and COMP[3], respectively. The combination of the signals COMP[0], COMP[1], COMP[2], and COMP[3] is the code value COMP[3:0]. For example, when the switch element SWC1 is on, Vth=Vths. When VC2≤Vths≤VC3, the evaluation result corresponding to the threshold voltage Vths is the code value COMP[3:0]= "0011".

For example, in a case where it is desired to employ a threshold voltage higher than or equal to VC1 but lower than or equal to VC3, the threshold corresponding to a code value COMP[3]="0001" or "0011" may be employed, but not necessarily, and a threshold voltage higher than or equal to VC1 but lower than or equal to VC4 may instead be employed.

Figure 13:
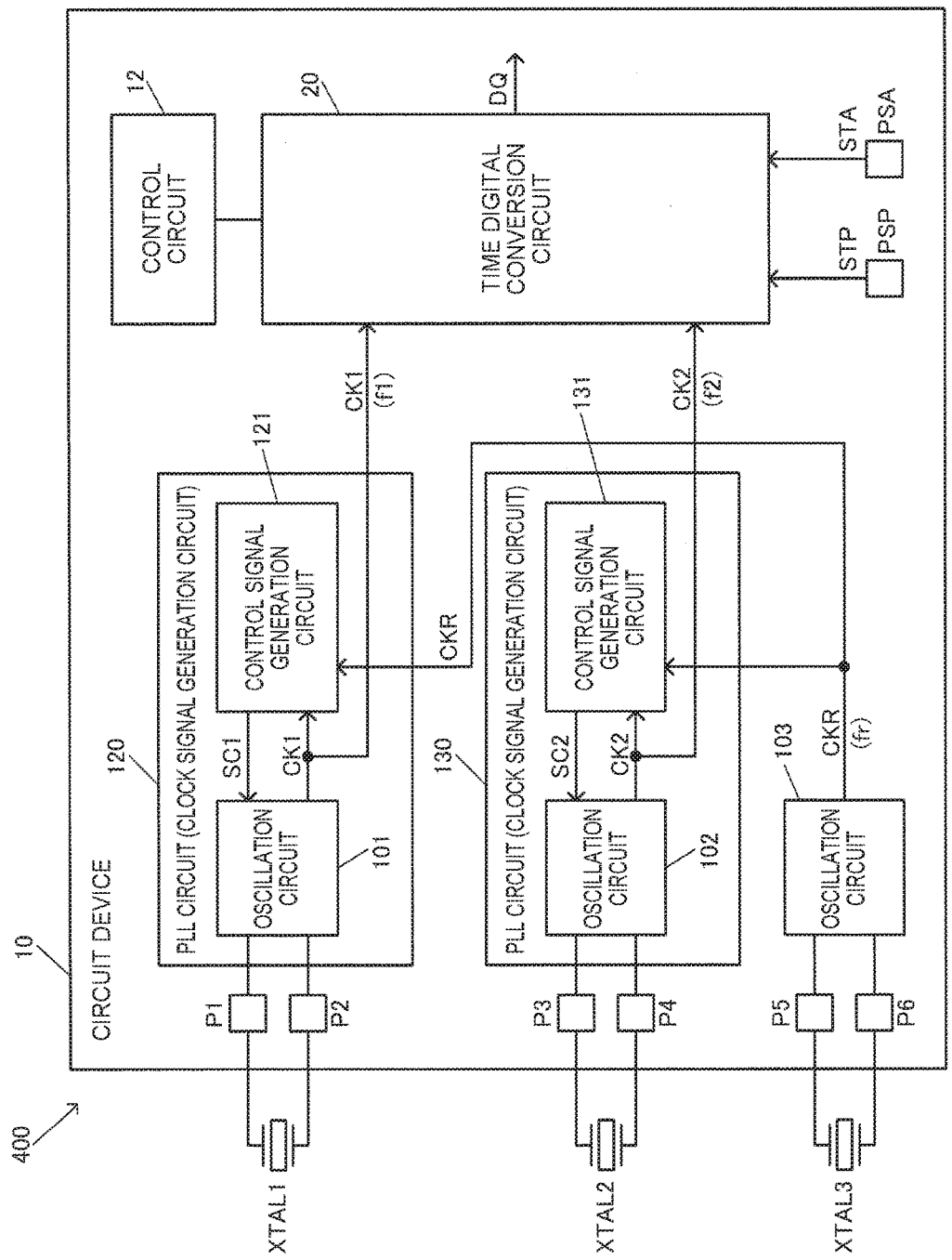
FIG. 13 shows a second example of the configurations of the circuit device and the physical quantity measurement apparatus.

5. Second Example of Configurations of Circuit Device and Physical Quantity Measurement Apparatus FIG. 13 shows a second example of the configurations of a circuit device including the time-to-digital converter according to the present embodiment and a physical quantity measurement apparatus including the circuit device. The circuit device 10 includes the time-to-digital converter 20 and PLL circuits 120 and 130. The circuit device 10 can further include an oscillation circuit 103, a control circuit 12, signal terminals PSA and PSP, terminals for oscillation P1 to P6. A physical quantity measurement apparatus 400 includes oscillators XTAL1 to XTAL3 and the circuit device 10. The signal terminals PSA and PSP and the terminals P1 to P6 are, for example, pads of an integrated circuit device or terminals of a package that accommodates the circuit device 10.

The signals STA and STP via the signal terminals PSA and PSP are inputted to the time-to-digital converter 20. The time-to-digital converter 20 converts the time difference between the transition timing of the signal STA and the transition timing of the signal STP into the digital value DQ. The oscillation circuit 103 performs an oscillation action of causing the oscillator XTAL3 to oscillate to generate a reference clock signal CKR having a clock frequency fr. The PLL circuits 120 and 130 generate the reference clock signals CK1 and CK2, which each synchronize with the reference clock signal CKR in terms of phase, respectively. Specifically, a control signal generation circuit 121 of the PLL circuit 120 outputs a control signal SC1 based on comparison between the phase of the reference clock signal CK1 from the oscillation circuit 101 and the phase of the reference clock signal CKR from the oscillation circuit 103 to the oscillation circuit 101 to cause CK1 to synchronize with CKR in terms of phase. Further, a control signal generation circuit 131 of the PLL circuit 130 outputs a control signal SC2 based on comparison between the phase of the reference clock signal CK2 from the oscillation circuit 102 and the phase of the reference clock signal CKR from the oscillation circuit 103 to the oscillation circuit 102 to cause CK2 to synchronize with CKR in terms of phase. When the reference clock signals CK1 and CK2 synchronize with the reference clock signal CKR in terms of phase, CK1 and CK2 synchronize with each other in terms of phase, whereby the frequencies and phases of CK1 and CK2 can each be maintained in a predetermined relationship. For example, in the case where the clock frequencies of CK1 and CK2 are f1 and f2, respectively, the PLL circuits 120 and 130 (synchronizing circuits, control sections) perform control that allows the frequency relationship N/f1=M/f2 (N and M are integers greater than or equal to 2 and different from each other) to be maintained. Performing the time digital conversion using the thus generated reference clock signals CK1 and CK2 allows time digital conversion with CK1 and CK2 set in an appropriate frequency relationship, whereby high-quality time digital conversion is achieved. The control circuit 12 carries out a variety of processes, such as the process of controlling the circuit device 10 and a calculation process. The control circuit 12 is achieved, for example by a logic circuit. The oscillation circuits 101, 102, and 103 can each include a buffer circuit, resistors, capacitors, and other circuit elements as well as a power source circuit (regulator) that supplies electric power for the oscillation circuits and other components.

6. Electronic Apparatus, Vehicle

Figure 14:
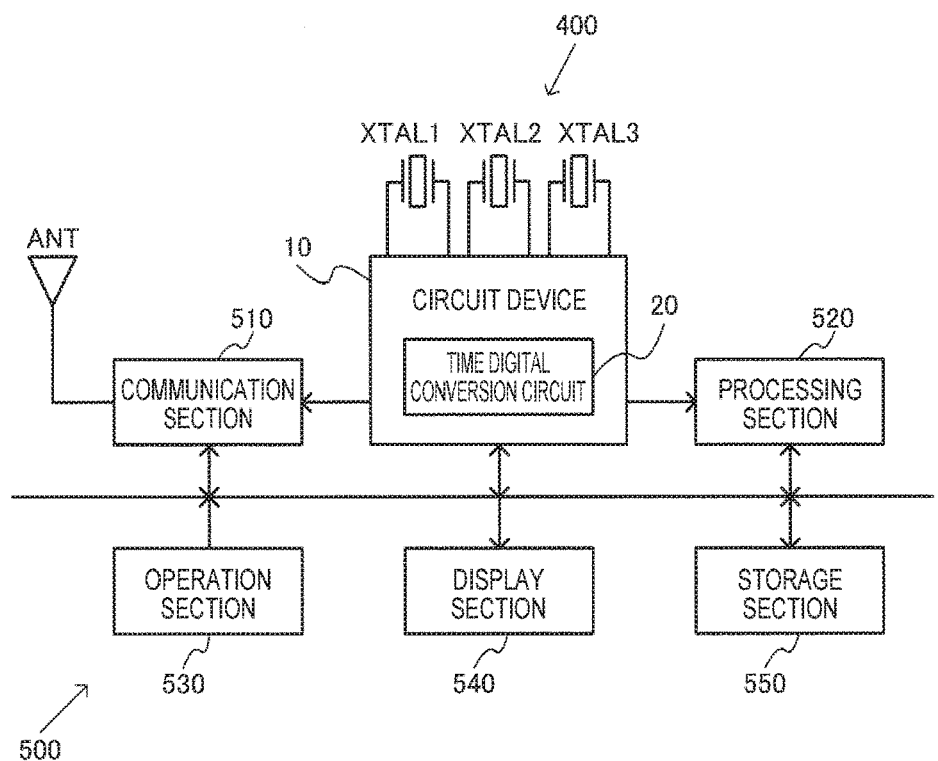
FIG. 14 shows an example of the configuration of an electronic apparatus.

FIG. 14 shows an example of the configuration of an electronic apparatus including the time-to-digital converter (circuit device, physical quantity measurement apparatus) according to the present embodiment. An electronic apparatus 500 includes the physical quantity measurement apparatus 400, which includes the circuit device 10 and the oscillators XTAL1 to XTAL3, and a processing section 520. The electronic apparatus 500 can further include a communication section 510, an operation section 530, a display section 540, a storage section 550, and an antenna ANT.

Conceivable examples of the electronic apparatus 500 may include a measurement instrument that measures a distance, time, a flow speed, a flow rate, or any other physical quantity, a biological information measurement instrument that measures biological information (such as ultrasonic measurement apparatus, pulse wave meter, blood pressure measurement apparatus), an in-vehicle instrument (such as instrument for automatic driving), a network-related instrument, such as a base station and a router. Other conceivable examples of the electronic apparatus 500 may include a head mounted display, a timepiece-related instrument, or any other wearable instrument, a robot, a printer, a projector, a mobile information terminal (such as smartphone), a content provider that distributes contents, or a digital camera, a video camcorder, or any other video instrument.

The communication section 510 (wireless communication circuit) receives data from an external apparatus via the antenna ANT and transmits data to the external apparatus. The processing section 520 (processing circuit) controls the electronic apparatus 500 and performs a variety of types of digital processing on the data transmitted and received via the communication section 510. The function of the processing section 520 can be achieved, for example, by a processor, such as a microcomputer. The operation section 530 allows a user to perform input operation and can be achieved by operation buttons, a touch panel display, or any other component. The display section 540 displays a variety of pieces of information and can be achieved by a display based on liquid crystal, organic EL, or any other technology. The storage section 550 stores data, and the function of the storage section 550 can be achieved by a RAM, a ROM, or any other semiconductor memory, a hard disk drive (HDD), or any other component.

Figure 15:
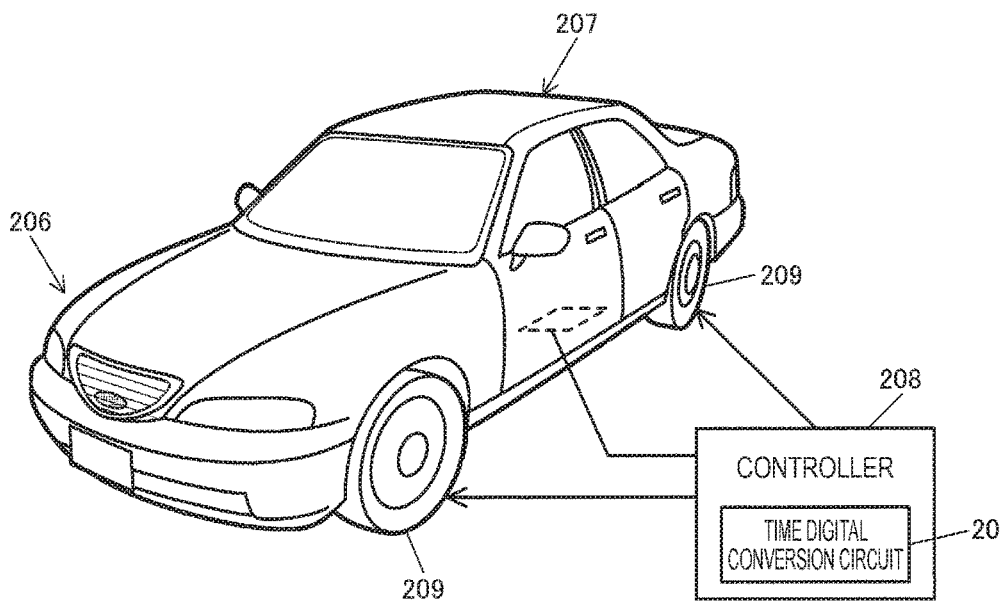
FIG. 15 shows an example of a vehicle.

FIG. 15 shows an example of a vehicle including the time-to-digital converter (circuit device, physical quantity measurement apparatus) according to the present embodiment. The time-to-digital converter (circuit device, physical quantity measurement apparatus) according to the present embodiment can be incorporated, for example, in a variety of vehicles, such as a car, an airplane, a motorcycle, a bicycle, a robot, or a ship. The vehicle is an instrument/apparatus that includes, for example, a drive mechanism, such as an engine and a motor, a steering mechanism, such as a steering wheel and a rudder, and a variety of electronic apparatus (in-vehicle instruments) and moves on the ground, in the sky, or on the sea. FIG. 15 schematically shows an automobile 206 as a specific example of the vehicle. The automobile 206 incorporates the physical quantity measurement apparatus (not shown) according to the present embodiment. A controller 208 performs a variety of types of control based on physical quantity information measured by the physical quantity measurement apparatus. For example, in a case where information on the distance to an object around the automobile 206 is measured as the physical quantity information, the controller 208 uses the measured distance information to perform a variety of types of control for automatic driving. The controller 208, for example, controls the degree of hardness of the suspension in accordance with the attitude of a vehicle body 207 and performs braking control on individual wheels 209. An instrument that incorporates the time-to-digital converter 20 (circuit device, physical quantity measurement apparatus) according to the present embodiment is not limited to the controller 208, and the time-to-digital converter 20 can be incorporated in a variety of instruments provided in a vehicle, such as the automobile 206 and a robot.

The present embodiment has been described above in detail, and a person skilled in the art will readily appreciate that a large number of variations are conceivable to the extent that they do not substantially depart from the novel items and advantageous effects of the invention. Such variations are all therefore intended to fall within the scope of the invention. For example, a term described at least once in the specification or the drawings along with a different term having a boarder meaning or the same meaning can be replaced with the different term anywhere in the specification or the drawings. Further, all combination of the present embodiment and the variations fall within the scope of the invention. Moreover, the configuration, action, and other factors of each of the time-to-digital converter, the circuit device, the electronic apparatus, or the vehicle are not limited to those described in the present embodiment, and a variety of changes can be made thereto.

The entire disclosure of Japanese Patent Application No. 2017-159122, filed Aug. 22, 2017 is expressly incorporated by reference herein.

What is claimed is:

1. A time-to-digital converter comprising:
 a first clock signal generation circuit configured to receive a first reference clock signal having a first clock frequency and generate a first cycle signal having a voltage level that monotonously increases or decreases in a cycle corresponding to the first clock frequency, and further generate a first clock signal based on a first signal and the first cycle signal;
 a second clock signal generation circuit configured to receive a second reference clock signal having a second clock frequency different from the first clock frequency and generate a second cycle signal having a voltage level that monotonously increases or decreases in a cycle corresponding to the second clock frequency, and further generate a second clock signal based on a second signal and the second cycle signal; and
 a processing circuit configured to convert a time difference between a transition timing of the first signal and a transition timing of the second signal into a digital value based on the first and second clock signals.

2. The time-to-digital converter according to claim 1, wherein the first clock signal generation circuit generates the first clock signal, a frequency of which is equal to the first clock frequency and a phase of which is set with reference to the transition timing of the first signal, based on the first signal and the first cycle signal, and the second clock signal generation circuit generates the second clock signal, a frequency of which is equal to the second clock frequency and a phase of which is set with reference to the transition timing of the second signal, based on the second signal and the second cycle signal.

3. The time-to-digital converter according to claim 1, wherein the first clock signal generation circuit includes a first holding circuit that holds the voltage level of the first cycle signal at the transition timing of the first signal as a first threshold voltage, and a first comparison circuit that compares the first threshold voltage with the voltage level of the first cycle signal and outputs the first clock signal, and the second clock signal generation circuit includes a second holding circuit that holds the voltage level of the second cycle signal at the transition timing of the second signal as a second threshold voltage, and a second comparison circuit that compares the second threshold voltage with the voltage level of the second cycle signal and outputs the second clock signal.

4. The time-to-digital converter according to claim 3, wherein the first clock signal generation circuit includes a first mask circuit that masks first one or plurality of pulses of the first clock signal, and the second clock signal generation circuit includes a second mask circuit that masks first one or plurality of pulses of the second clock signal.

5. The time-to-digital converter according to claim 1, wherein the processing circuit includes a first phase comparison circuit that compares the first clock signal with the second clock signal in terms of phase, and outputs the digital value based on a result of the phase comparison.

6. The time-to-digital converter according to claim 1, further comprising:

a third clock signal generation circuit that generates a third cycle signal having a phase different from a phase of the first cycle signal based on the first reference clock signal and further generates a third clock signal based on the first signal and the third cycle signal, and a fourth clock signal generation circuit that generates a fourth cycle signal having a phase different from a phase of the second cycle signal based on the second reference clock signal and further generates a fourth clock signal based on the second signal and the fourth cycle signal.

7. The time-to-digital converter according to claim 6, wherein the processing circuit includes a first phase comparison circuit that compares the first clock signal with the second clock signal in terms of phase, a second phase comparison circuit that compares the first clock signal with the fourth clock signal in terms of phase, a third phase comparison circuit that compares the third clock signal with the second clock signal in terms of phase, and a fourth phase comparison circuit that compares the third clock signal with the fourth clock signal in terms of phase, and the processing circuit outputs the digital value based on results of the phase comparison performed by the first to fourth phase comparison circuits.

8. The time-to-digital converter according to claim 7, wherein the first clock signal generation circuit includes a first holding circuit that holds the voltage level of the first cycle signal at the transition timing of the first signal as a first threshold voltage, and a first comparison circuit that compares the first threshold voltage with the voltage level of the first cycle signal and outputs the first clock signal, the second clock signal generation circuit includes a second holding circuit that holds the voltage level of the second cycle signal at the transition timing of the second signal as a second threshold voltage, and a second comparison circuit that compares the second threshold voltage with the voltage level of the second cycle signal and outputs the second clock signal, the third clock signal generation circuit includes a third holding circuit that holds a voltage level of the third cycle signal at the transition timing of the first signal as a third threshold voltage, and a third comparison circuit that compares the third threshold voltage with the voltage level of the third cycle signal and outputs the third clock signal, the fourth clock signal generation circuit includes a fourth holding circuit that holds a voltage level of the fourth cycle signal at the transition timing of the second signal as a fourth threshold voltage, and a fourth comparison circuit that compares the fourth threshold voltage with the voltage level of the fourth cycle signal and outputs the fourth clock signal, and the processing circuit includes a threshold evaluation circuit that evaluates whether or not the first to fourth threshold voltages each fall within a given voltage range, and selects any of results of the phase comparison performed by the first to fourth phase comparison circuits based on results of the evaluation and uses a selected result of the phase comparison to determine the digital value.

9. A circuit device comprising the time-to-digital converter according to claim 1.

10. The circuit device according to claim 9, further comprising:

a first oscillation circuit that oscillates a first resonator to generate a first oscillation signal and further generates the first reference clock signal based on the first oscillation signal, and a second oscillation circuit that oscillates a second resonator to generate a second oscillation signal and further generates the second reference clock signal based on the second oscillation signal.

11. A physical quantity measurement apparatus comprising the time-to-digital converter according to claim 1.

12. An electronic apparatus comprising the time-to-digital converter according to claim 1.

13. A vehicle comprising the time-to-digital converter according to claim 1.

* * * * *